(12) United States Patent
Chu et al.

(10) Patent No.: US 12,119,345 B2
(45) Date of Patent: Oct. 15, 2024

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Chia-Ho Chu, Hsinchu (TW); Yung-Chung Chen, Hsinchu (TW); Chih-Tang Peng, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 425 days.

(21) Appl. No.: 17/395,879

(22) Filed: Aug. 6, 2021

(65) Prior Publication Data
US 2023/0041640 A1 Feb. 9, 2023

(51) Int. Cl.
*H01L 27/088* (2006.01)
*H01L 21/02* (2006.01)
*H01L 21/8234* (2006.01)

(52) U.S. Cl.
CPC ...... *H01L 27/0886* (2013.01); *H01L 21/0234* (2013.01); *H01L 21/823431* (2013.01); *H01L 21/823481* (2013.01)

(58) Field of Classification Search
CPC ......... H01L 21/823481; H01L 21/0234; H01L 21/02271; H01L 21/823878
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2013/0052795 A1* | 2/2013 | Watanabe | H01L 21/76229 257/E21.546 |
| 2019/0363024 A1* | 11/2019 | Yu | H01L 29/66545 |
| 2019/0386002 A1* | 12/2019 | Wu | H10B 10/12 |

* cited by examiner

*Primary Examiner* — Tuan A Hoang
(74) *Attorney, Agent, or Firm* — WPAT LAW; Anthony King

(57) ABSTRACT

A semiconductor structure includes a first FinFET device disposed over a substrate, a second FinFET device disposed over the substrate, and an isolation structure. The first FinFET device includes at least a first fin and a first metal gate structure over the first fin. The second FinFET device includes at least a second fin and a second metal gate structure over the second fin. The isolation structure is disposed between the first metal gate structure and the second metal gate structure. The isolation structure includes a dielectric feature and a dielectric layer. The dielectric layer is between the dielectric feature and the first metal gate structure, between the dielectric feature and the second metal gate structure, and between the dielectric feature and the substrate. The dielectric feature and the dielectric layer include different materials and different thicknesses.

20 Claims, 23 Drawing Sheets

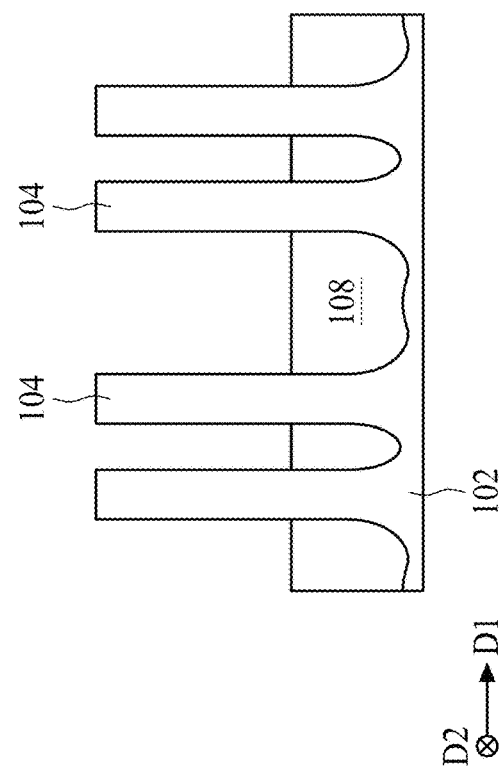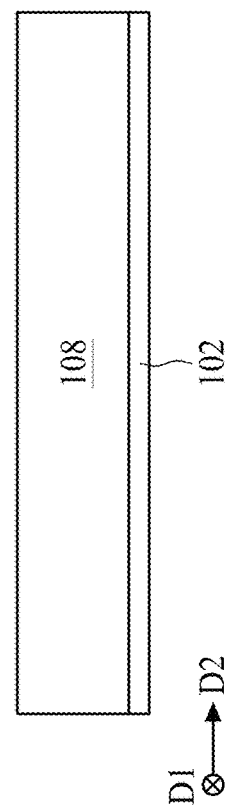

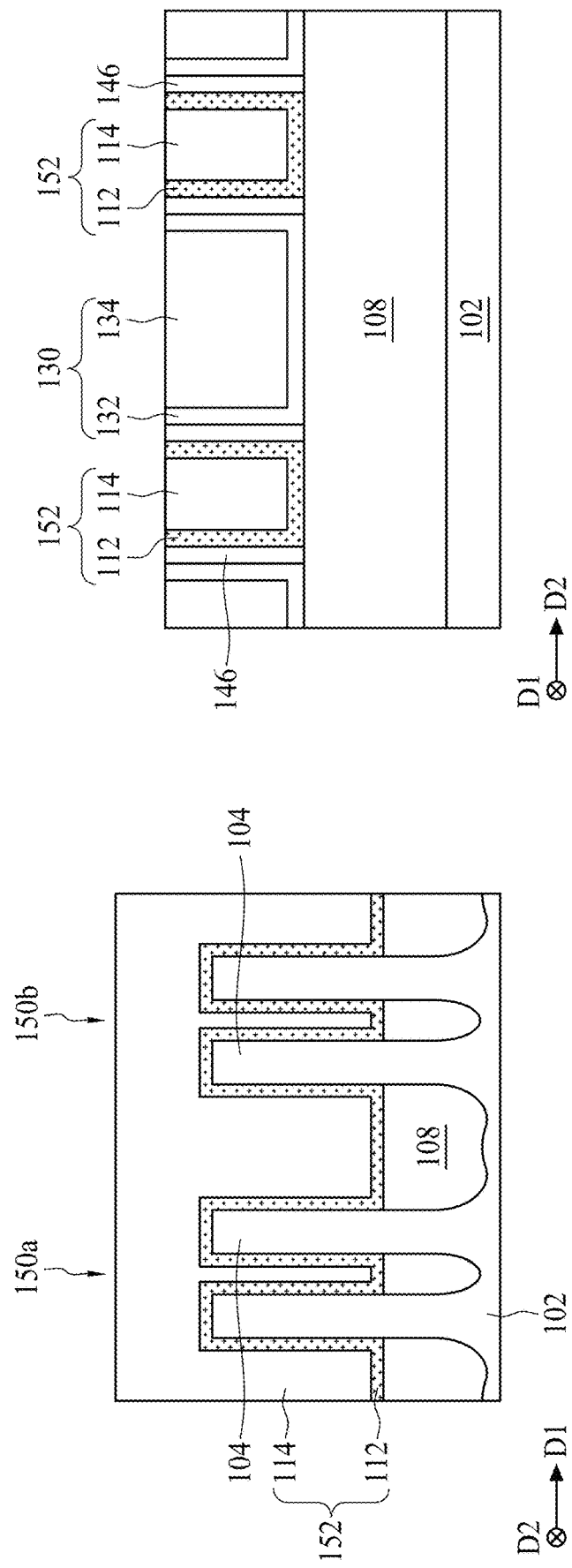

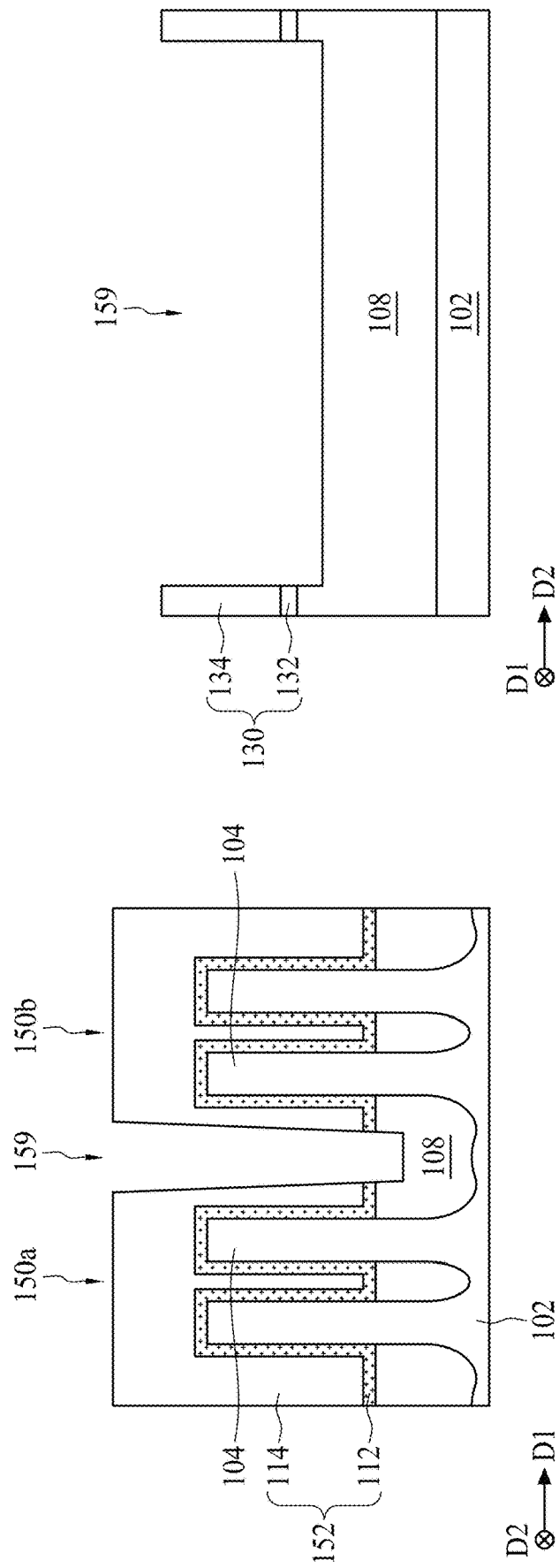

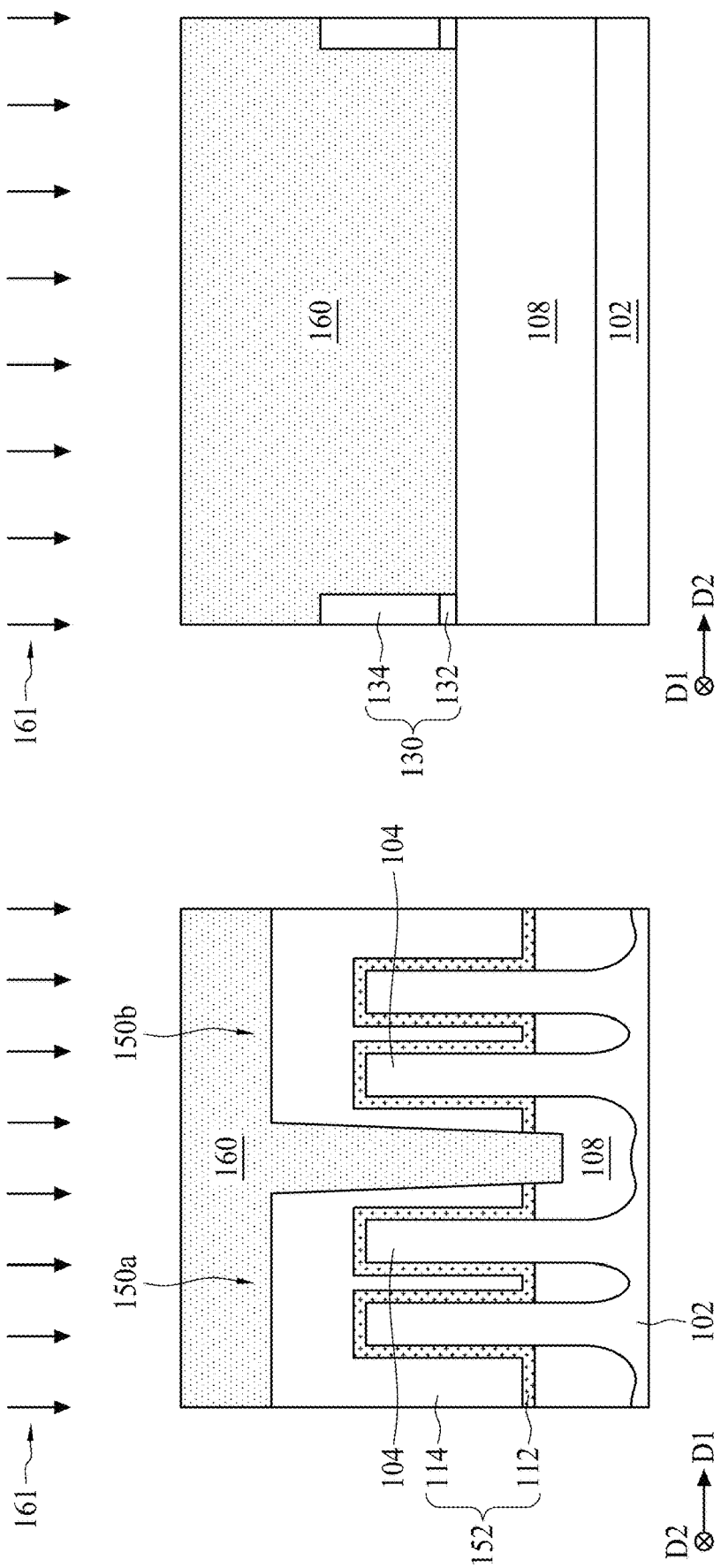

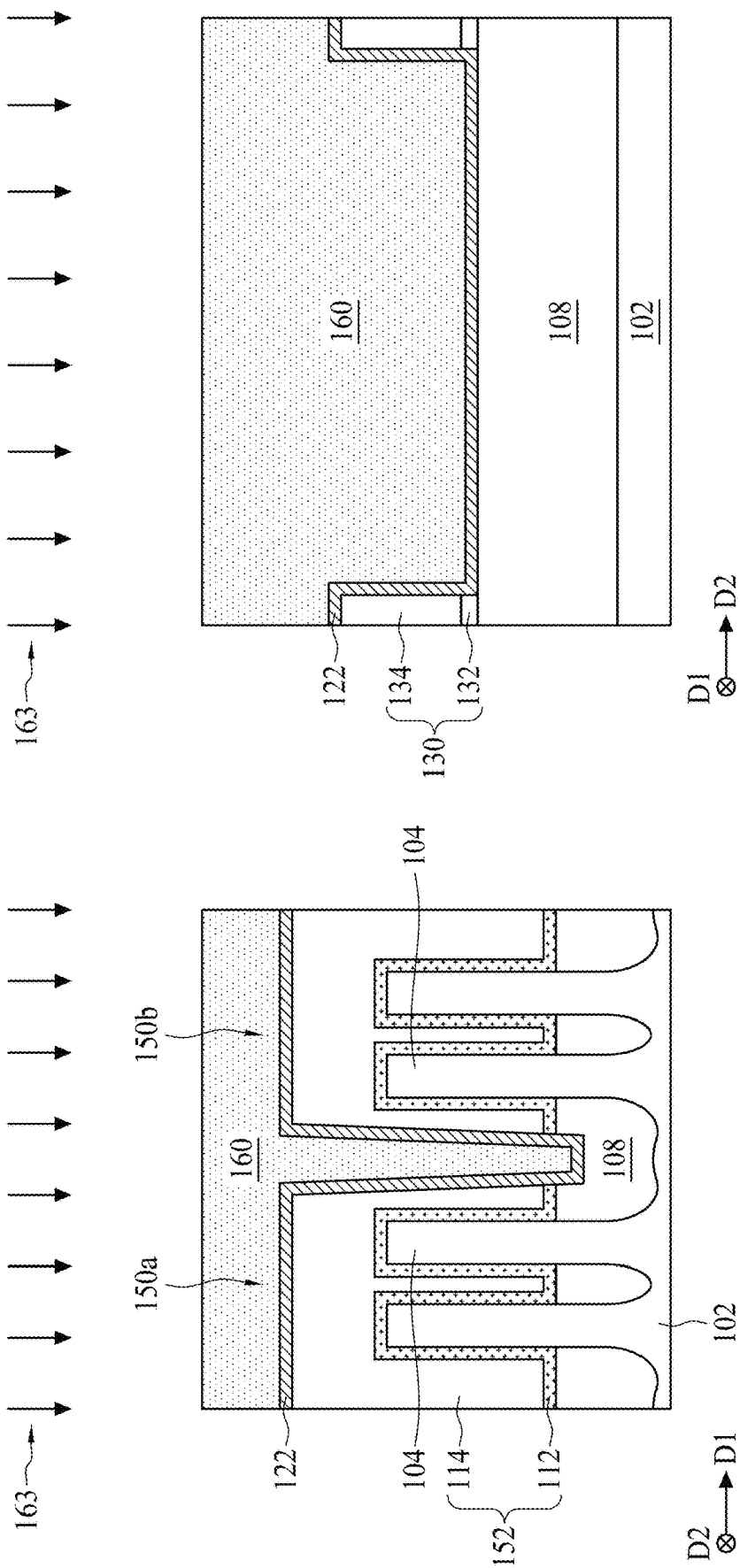

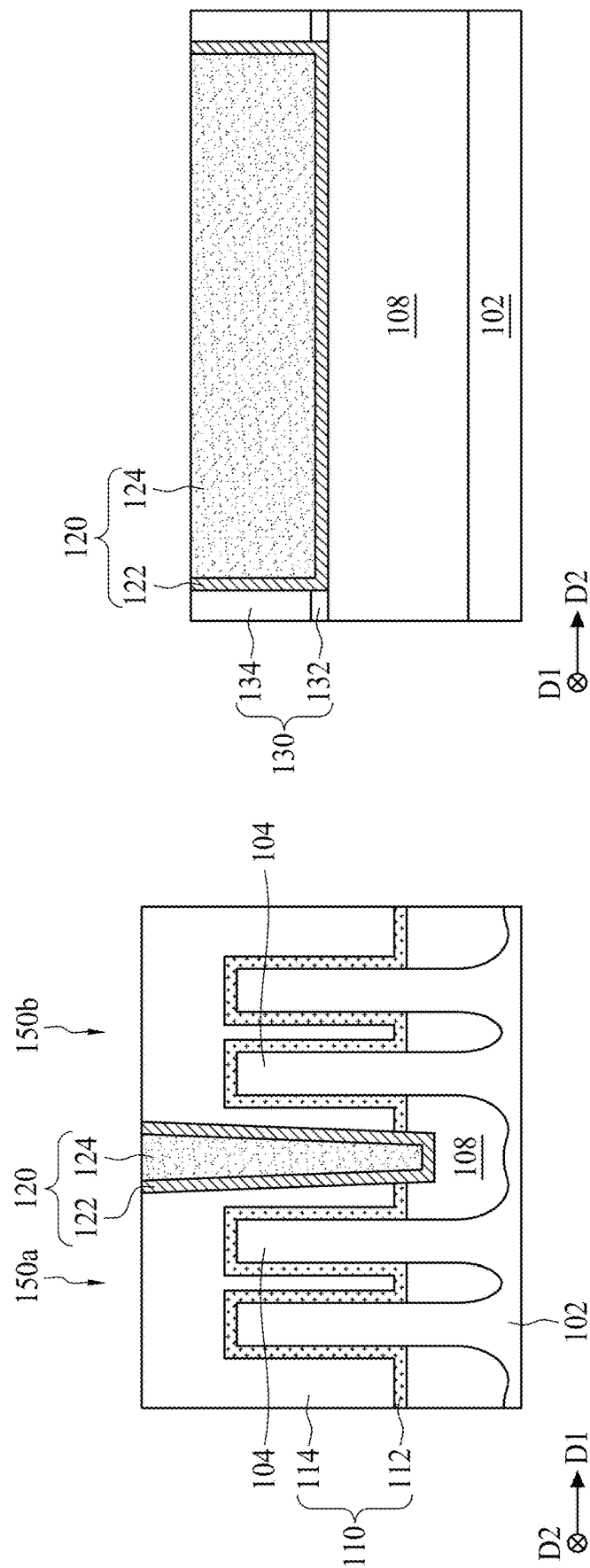

SEMICONDUCTOR STRUCTURE AND METHOD FOR FORMING THE SAME

BACKGROUND

The electronics industry has experienced an ever increasing demand for smaller and faster electronic devices that are able to support greater numbers of increasingly complex and sophisticated functions. Accordingly, there is a continuing trend in the semiconductor industry to manufacture low-cost, high-performance, low-power integrated circuits (ICs). Thus far, such goals have been achieved in large part by scaling down semiconductor IC dimensions (e.g., minimum feature size) and thereby improving production efficiency and reducing associated costs. However, such downscaling has also introduced increased complexity to the semiconductor manufacturing process. Thus, the realization of continued advances in semiconductor ICs and devices requires similar advances in semiconductor manufacturing processes and technology.

As technology nodes achieve progressively smaller scales, in some IC designs, researchers have hoped to replace a typical polysilicon gate with a metal gate to improve device performance by decreasing feature sizes. One approach to forming the metal gate is called a "gate-last" approach, sometimes referred to as a replacement polysilicon gate (RPG) approach. In the RPG approach, the metal gate is fabricated last, which allows for a reduced number of subsequent operations.

Further, as the dimensions of a transistor decrease, the thickness of the transistor's gate dielectric layer may be reduced to maintain performance with a decreased gate length. In order to reduce gate leakage, a high dielectric constant (high-k or HK) gate dielectric layer is used to provide a thickness as effective as that provided by a typical gate oxide used in larger technology nodes. A high-k metal gate (HKMG) approach including a metal gate electrode and the high-k gate dielectric layer is therefore recognized. However, the HKMG approach is a complicated approach, and many issues arise.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A to 14B illustrate a method for manufacturing a semiconductor structure at various stages according to aspects of the present disclosure in one or more embodiments, wherein FIGS. 4A, 5A, 6A, 7A, 8A, 9A, 10A, 11A, 12A, 13A and 14A are cross-sectional views of the semiconductor structure taken along line I-I' of FIG. 1, and FIGS. 4B, 5B, 6B, 7B, 8B, 9B, 10B, 11B, 12B, 13B and 14B are cross-sectional views of the semiconductor structure taken along line II-IP of FIG. 1.

FIGS. 15A to 18B illustrate a method for manufacturing a semiconductor structure at various stages according to aspects of the present disclosure in one or more embodiments, wherein 15A, 16A, 17A and 18A are cross-sectional views of the semiconductor structure taken along line I-I' of FIG. 1, and FIGS. 15B, 16B, 17B and 18B are cross-sectional views of the semiconductor structure taken along line II-II' of FIG. 1.

DETAILED DESCRIPTION

Figure 1:
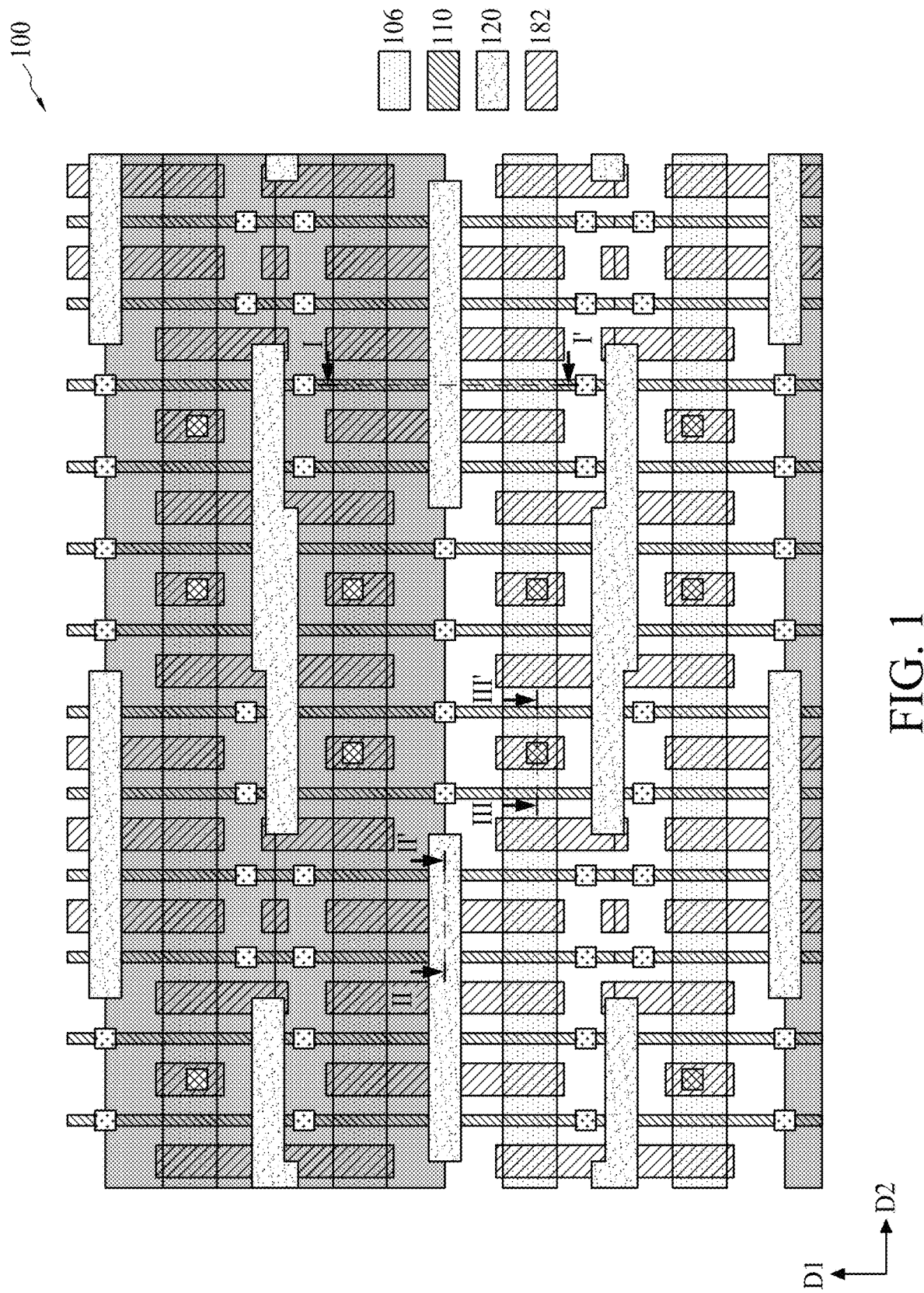
FIG. 1 shows schematic drawing of a layout structure of a semiconductor structure according to aspects of the present disclosure in one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the normal deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present disclosure is generally related to a semiconductor structure and the method for forming the same. Further, the method for forming the semiconductor structure uses a cut metal gate (CMG) process. The term "cut metal gate process" refers to a fabrication process where after a metal gate feature (e.g., a high-k metal gate or HI(MG) replaces a sacrificial gate structure (e.g., a polysilicon gate), the metal gate feature is cut (e.g., by an etching process) to separate the metal gate feature into two or more portions. Each portion functions as a metal gate structure for an individual transistor. An isolation material is subsequently deposited into trenches between the adjacent metal gate structures. These trenches are referred to as cut metal gate trenches, or CMG trenches.

In some comparative approaches, the CMG trenches are filled with high-k dielectric materials. However, devices may suffer from increased capacitance due to the high-k dielectric materials. In some embodiments, a low-k dielectric material may be used to replace the high-k dielectric material in order to reduce the capacitance. In such comparative approaches, the low-k dielectric material may suffer from consumption or damage during subsequently-performed etching in metal-to-device (MD) fabrication. Accordingly, a metal extrusion issue, in which metal is observed in the low-k dielectric material used to fill the CMG trenches, is raised.

Figure 2:
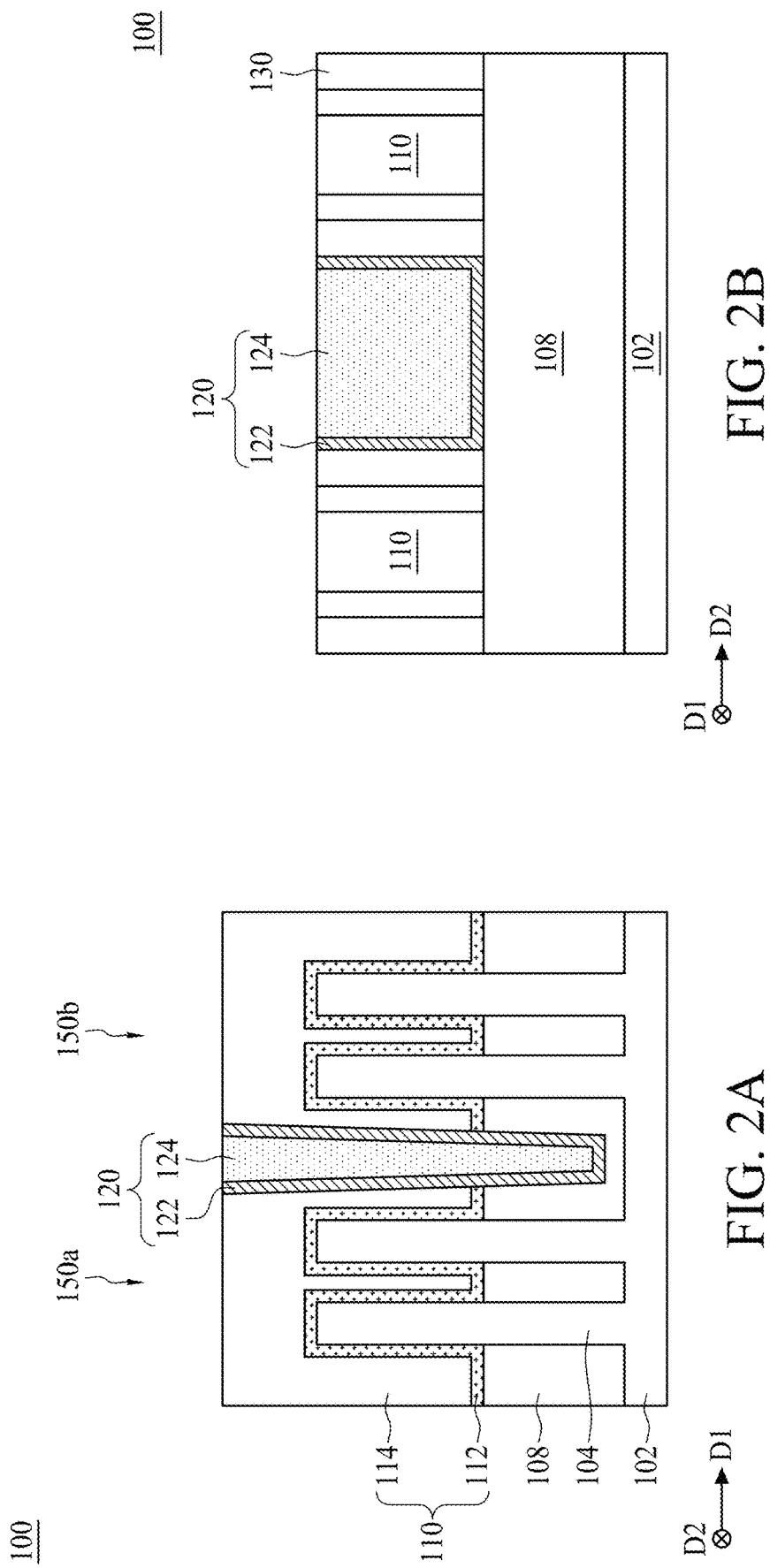
FIG. 2A illustrates a cross-sectional view of the semiconductor structure taken along line I-I' of FIG. 1.
FIG. 2B illustrates a cross-sectional view of the semiconductor structure taken along line II-IP of FIG. 1.

FIG. 1 shows a layout structure of a portion of a semiconductor structure according to aspects of the present disclosure. FIG. 2A illustrates a cross-sectional view of the semiconductor structure taken along line I-I' of FIG. 1, and FIG. 2B illustrates a cross-sectional view of the semiconductor structure taken along line II-II' of FIG. 1. Referring to FIGS. 1, 2A and 2B, the semiconductor structure 100 includes a substrate 102, a plurality of fins 104 (shown in FIG. 2A) disposed in a fin region 106 and protruding from the substrate 102, an isolation structure 108 over the substrate 102 and between the fins 104, and a plurality of metal gate structures 110 disposed over the fins 104 and the isolation structure 108. Each metal gate structure 110 includes a high-k gate dielectric layer 112, and a gate conductive layer 114 over the high-k gate dielectric layer 112. The gate conductive layer 112 includes one or more layers of metallic materials. Therefore, each metal gate structure 110 is also referred to as a high-k metal gate (or HK MG). The metal gate structures 110 may further include an interfacial layer (not shown) under the high-k gate dielectric layer 112.

As shown in FIGS. 1, 2A and 2B, the metal gate structures 110 extend in a first direction D1, and the fins 104 (and the fin regions 106) extend in a second direction D2. The second direction D2 is different from the first direction D1. Generally, the second direction D2 is perpendicular to the first direction D1. Further, the fins 104 are generally parallel to each other, and the metal gate structures 110 are generally parallel to each other. The semiconductor structure 100 further includes an isolation structure 120 extending in the second direction D2 and between two adjacent metal gate structures 110. Further, the isolation structure 120 separates the adjacent metal gate structures 110. Each metal gate structure 110 covers and engages the respective fins 104 to form individual FinFET devices. The two metal gate structures 110 separated by the isolation structure 120 have a same conductivity type. In some embodiments, the two metal gate structures 110 separated by the isolation structure 120 may have same materials. In some embodiments, the isolation structure 120 is disposed between the fins 104 of two FinFET devices. The isolation structure 120 therefore may be said to be disposed between two FinFET devices, and the two FinFET devices have a same conductive type. In some embodiments, the semiconductor structure 100 further includes a dielectric structure 130 over the substrate 102. The FinFET devices and the isolation structure 120 may be disposed in the dielectric structure 130.

In some embodiments, the substrate 102 includes a silicon (Si) substrate. In other embodiments, the substrate 102 may include another elementary semiconductor, such as germanium (Ge); a compound semiconductor including silicon carbide (SiC), gallium arsenide (GaAs), gallium phosphide (GaP), indium phosphide (InP), indium arsenide (InAs), or indium antimonide (InSb); an alloy semiconductor including silicon germanium (SiGe), gallium arsenide phosphide (GaAsP), aluminum indium phosphide (AlInP), aluminum gallium arsenide (AlGaAs), gallium indium arsenide (GaInAs), gallium indium phosphide (GaInP), or gallium indium arsenide phosphide (GaInAsP); or a combination thereof.

The fins 104 are disposed in the fin region 106. In some embodiments, two fins 104 are disposed in each fin region 106, but the disclosure is not limited thereto. The fins 104 include one or more semiconductor materials such as Si, Ge, SiC, GaAs, GaP, InP, InAs, InSb, SiGe, GaAsP, AlInP, AlGaAs, GaInAs, GaInP, and GaInAsP. In some embodiments, the fins 104 may have alternately stacked layers of two different semiconductor materials, such as layers of Si and SiGe alternately stacked. The fins 104 may additionally include dopants for improving the performance of the FinFET device. For example, the fins 104 may include n-type dopant(s) such as phosphorus (P) or arsenic (As), or p-type dopant(s) such as boron (B) or indium (In).

The isolation structure 108 may include silicon oxide (SiO), silicon nitride (SiN), silicon oxynitride (SiON), fluoride-doped silicate glass (FSG), a low-k dielectric material, and/or other suitable insulating materials. The isolation structure 108 may include shallow trench isolation (STI) features. Other isolation structures, such as field oxide, local oxidation of silicon (LOCOS), and/or other suitable structures are possible. The isolation structure 108 may include a multi-layer structure, for example, a structure with one or more thermal oxide liner layers adjacent to the fins 104.

As mentioned above, the metal gate structures 110 include the high-k gate dielectric layer 112 and the gate conductive layer 114. The high-k gate dielectric layer 112 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The gate conductive layer 114 includes one or more metal layers, such as work function metal layer(s), conductive barrier layer(s), and gap-filling metal layer(s). The work function metal layer may be a p-type or an n-type work function layer depending on the type (PFET or NFET) of the device. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), and combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), and combinations thereof. The gap-filling metal layer may include Al, W, cobalt (Co), and/or other suitable materials.

The isolation structure 120 includes a dielectric layer 122 and a dielectric feature 124. As shown in FIGS. 2A and 2B, the dielectric layer 122 is disposed between the dielectric feature 124 and each metal gate structure 110, and between the dielectric feature 124 and the substrate 102. In some embodiments, the dielectric layer 122 is also between the dielectric feature 124 and the isolation structure 108. Further, the dielectric layer 122 is in contact with the dielectric structure 130, the two adjacent metal gate structures 110, and the isolation structure 108, as shown in FIGS. 2A and 2B. A thickness of the dielectric layer 122 is different from a thickness of the dielectric feature 124. As shown in FIGS. 2A and 2B, the thickness of the dielectric layer 122 is less than the thickness of the dielectric feature 124. In some embodiments, the thickness of the dielectric layer 122 is less than approximately 10 nanometers, but the disclosure is not limited thereto. The dielectric feature 124 and the dielectric layer 122 include different dielectric materials. In some embodiments, the dielectric feature 124 includes a low-k dielectric material, while the dielectric layer 122 includes a high-k dielectric material. In some embodiments, the dielectric feature 124 includes silicon oxide, and the dielectric layer 122 includes silicon nitride. In other embodiments, the dielectric feature 124 includes silicon oxide, and the dielectric layer 122 includes nitrogen-containing silicon oxide. In such embodiments, a nitrogen concentration of the dielectric layer 122 is approximately 10% greater than a nitrogen concentration of the dielectric feature 124. In some embodiments, the nitrogen concentration of the dielectric layer is approximately 10% to approximately 20% greater than the nitrogen concentration of the dielectric feature 124. In some embodiments, the dielectric feature 124 includes fluoride-doped silicate glass (FSG), a low-k dielectric material, and/or another suitable insulating material. Due to the low-k dielectric material of the dielectric feature 124, the capacitance between the two metal gate structures 110 is reduced.

Figure 3:
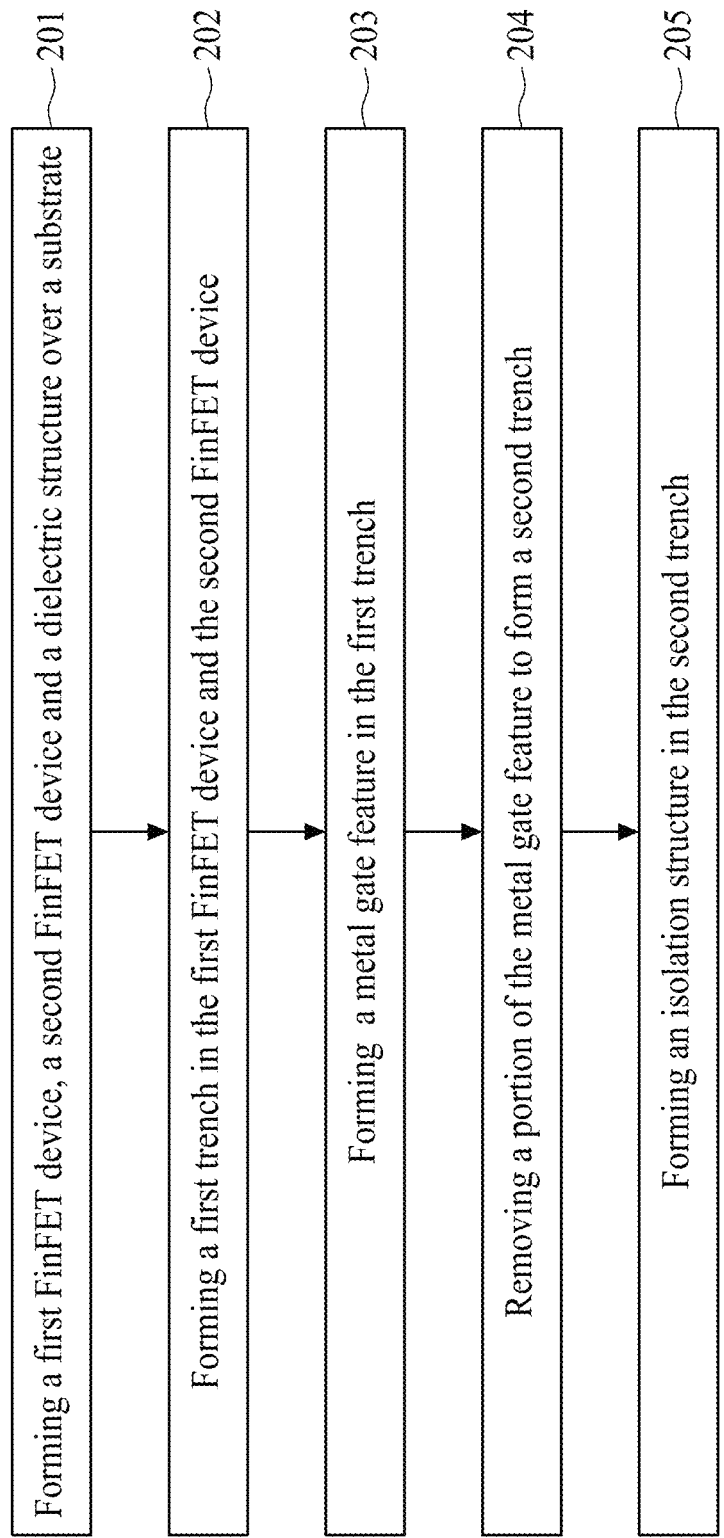
FIG. 3 shows a flowchart representing a method for forming a semiconductor structure according to aspects of the present disclosure.

FIG. 3 is a flowchart representing a method for forming a semiconductor structure 20 according to aspects of the present disclosure. The method 20 includes a number of operations (201, 202, 203, 204 and 205). The method 20 will be further described according to one or more embodiments. It should be noted that the operations of the method 20 may be rearranged or otherwise modified within the scope of the various aspects. It should be further noted that additional processes may be provided before, during, and after the method 20, and that some other processes may be only briefly described herein. Thus, other implementations are possible within the scope of the various aspects described herein.

FIGS. 4A to 14B illustrate a method for manufacturing a semiconductor structure at various stages according to aspects of the present disclosure in one or more embodiments, wherein FIGS. 4A, 5A, 6A, 7A, 8A, 9A, 10A, 11A, 12A, 13A and 14A are cross-sectional views of the semiconductor structure taken along line I-I' of FIG. 1, and FIGS. 4B, 5B, 6B, 7B, 8B, 9B, 10B, 11B, 12B, 13B and 14B are cross-sectional views of the semiconductor structure taken along line II-IF of FIG. 1.

In operation 201, a first FinFET device, a second FinFET device and a dielectric structure are formed over a substrate. Referring to FIGS. 4A and 4B, in some embodiments, the substrate 102 may be a wafer, such as a silicon wafer. The fins 104 can be formed by epitaxially growing one or more semiconductor layers in the entire area of the substrate 102 and then patterning the semiconductor layer to form the individual fins 104 in the fin region 106. The fins 104 may be patterned by any suitable method. For example, the fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a mandrel/spacer method is used to form the fins 104.

The isolation structure 108 may be formed by one or more deposition and etching methods. The deposition methods may include thermal oxidation, chemical oxidation, and chemical vapor deposition (CVD) such as flowable CVD (FCVD). The etching methods may include dry etching, wet etching, and chemical mechanical planarization (CMP).

Figures 5A, 5B:
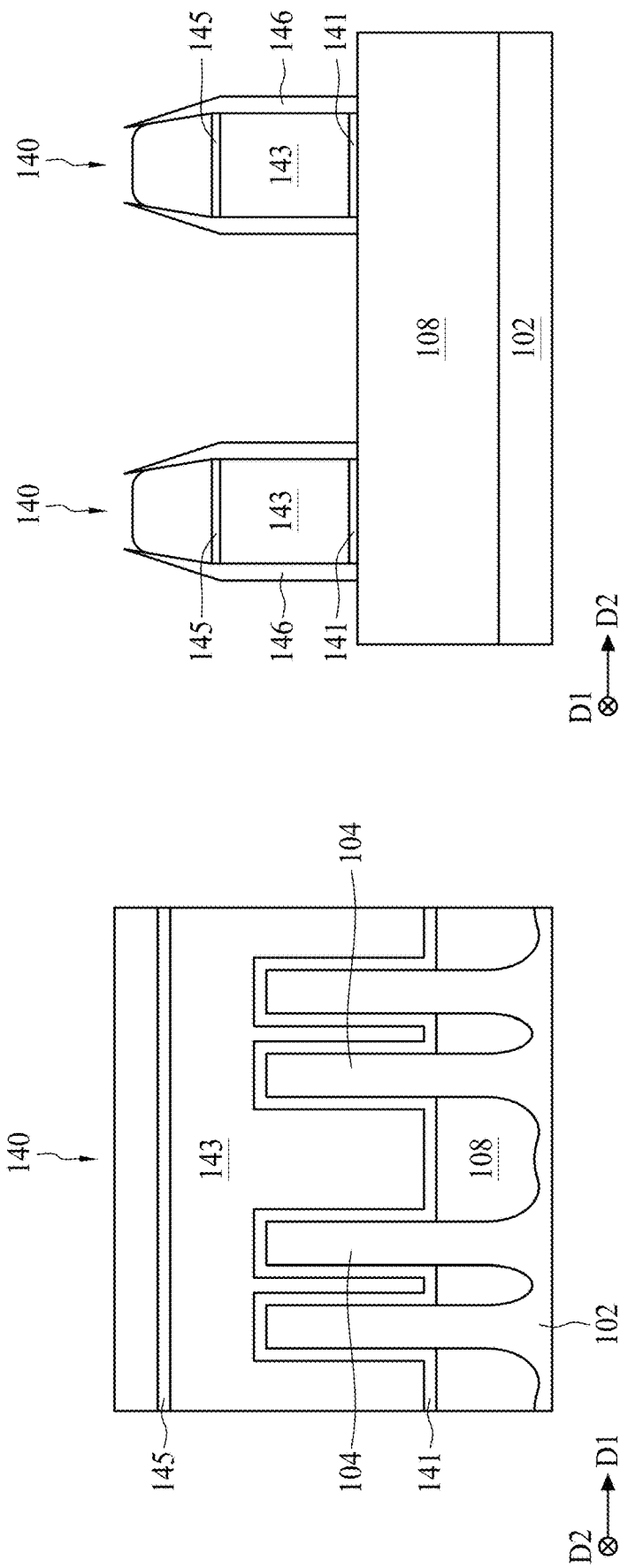

Referring to FIGS. 5A and 5B, in some embodiments, a plurality of sacrificial gate structures 140 are formed over the substrate 102 and the fins 104. In some embodiments, the sacrificial gate structure 140 includes a dielectric layer 141, an electrode layer 143, and a hard mask layer 145. In some embodiments, the dielectric layer 141 may include a dielectric material such as silicon oxide or silicon oxynitride, and may be formed by chemical oxidation, thermal oxidation, atomic layer deposition (ALD), chemical vapor deposition (CVD), and/or other suitable methods. The electrode layer 143 may include poly-crystalline silicon (poly-Si) and may be formed by suitable deposition processes such as low-pressure chemical vapor deposition (LPCVD) and plasma-enhanced CVD (PECVD). The hard mask layer 145 may be a multiple hard mask including one or more layers of dielectric material such as silicon oxide and/or silicon nitride, and may be formed by CVD or other suitable methods. The dielectric layer 141, the electrode layer 143 and the hard mask layer 145 may be patterned by photolithography and etching processes to form the sacrificial gate structures 140.

In some embodiments, spacers 146 are formed over sidewalls of the sacrificial gate structures 140. The spacers 146 may include a dielectric material, such as silicon oxide, silicon nitride, silicon oxynitride, silicon carbide, another dielectric material, or combinations thereof, and may include one or multiple layers of material. The spacers 146 may be formed by depositing a spacer material as a blanket over the isolation structure 108, the fins 104, and the sacrificial gate structures 140. Portions of the spacer material are removed from a top surface of the isolation structure 108, a top surface of the hard mask layer 145, and a top surface of the fins 104, while portions of the spacer material remain on the sidewalls of the sacrificial gate structures 140 and serve as the spacer 146.

Figure 6B:
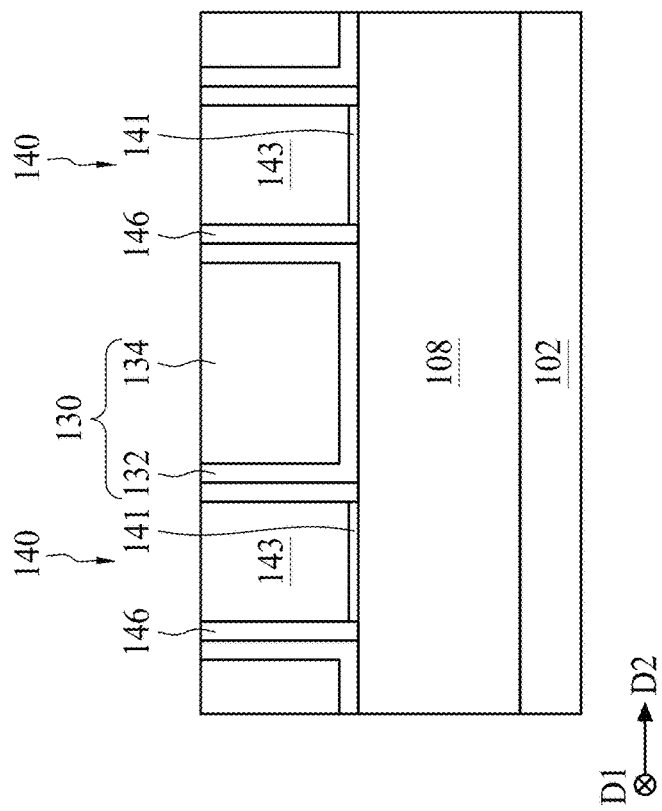
Figure 6A:
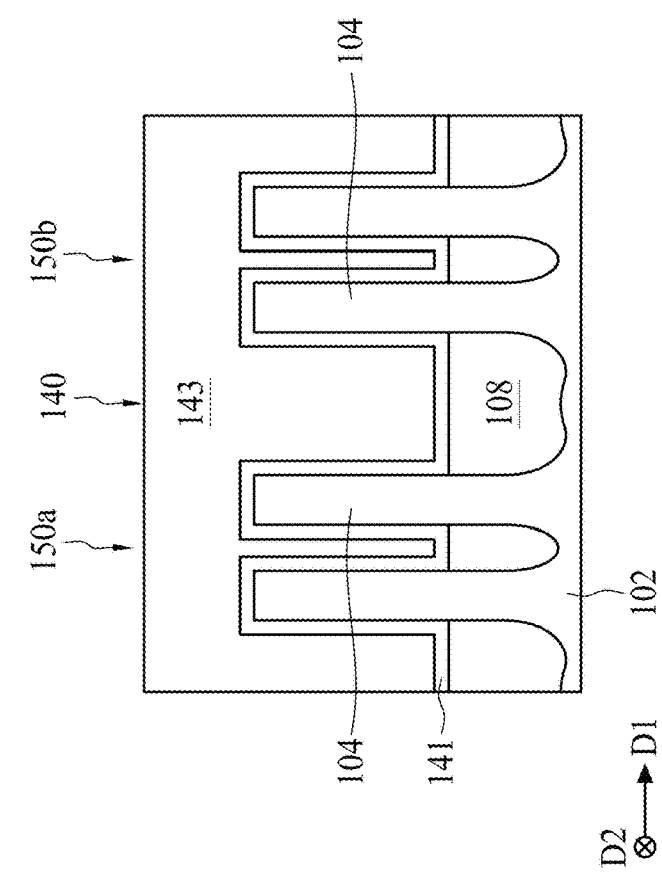

Referring to FIGS. 6A and 6B, in some embodiments, a source/drain structure 148 (shown in FIGS. 19 to 23) is formed at two sides of each sacrificial gate structure 140. In some embodiments, recesses (not shown) are formed by removing portions of the fins 104 exposed through the sacrificial gate structure 140, and semiconductor materials are epitaxially grown in the recesses. The semiconductor materials may be raised above the top surface of the fins 104. Such operations may form the source/drain structures 148 separately for n-FinFET and p-FinFET devices. In some embodiments, the source/drain structures 148 for the n-FinFET devices include n-type doped silicon, while the source/drain structures 148 for the p-FinFET devices include p-type doped silicon germanium.

Still referring to FIGS. 6A and 6B, in some embodiments, the dielectric structure 130 is formed over the substrate 102, the fins 104 and the sacrificial gate structures 140. The dielectric structure 130 may include a contact etch stop layer (CESL) 132 and an interlayer dielectric (ILD) 134. In some embodiments, the CESL 132 may include silicon nitride, silicon oxynitride, silicon nitride with oxygen (O) or carbon (C) elements, and/or other materials; and may be formed by CVD, PVD (physical vapor deposition), ALD, or other suitable methods. The ILD 134 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD 134 may be formed by PECVD, FCVD, or other suitable methods.

Accordingly, the first FinFET device 150a (including the sacrificial gate structure 140 and the source/drain structures 148), the second FinFET device 150b (including the sacrificial gate structure 140 and the source/drain structures 148), and the dielectric structure 130 are formed over the substrate 102. In some embodiments, the first FinFET device 150a and the second FinFET device 150b are arranged along the first direction D1. Further, the dielectric structure 130 surrounds the first FinFET device 150a and the second FinFET device 150b. In some embodiments, the sacrificial gate structures 140 of the first FinFET device 150a and the second FinFET device 150b are coupled to each other, as shown in FIG. 6A.

In operation 202, a first trench is formed in the first FinFET device 150a and the second FinFET device 150b.

Still referring to FIGS. 6A and 6B, in some embodiments, a portion of the dielectric structure 130 is removed. For example, a CMP operation may be performed to remove portions of the CESL 132 and portions of the ILD 134. Further, the CMP operation is performed to remove the hard mask layer 145 from the sacrificial gate structures 140. Accordingly, a top surface of the electrode layer 143 of each sacrificial gate structure 140 is exposed, as shown in FIGS. 6A and 6B.

Figure 7B:
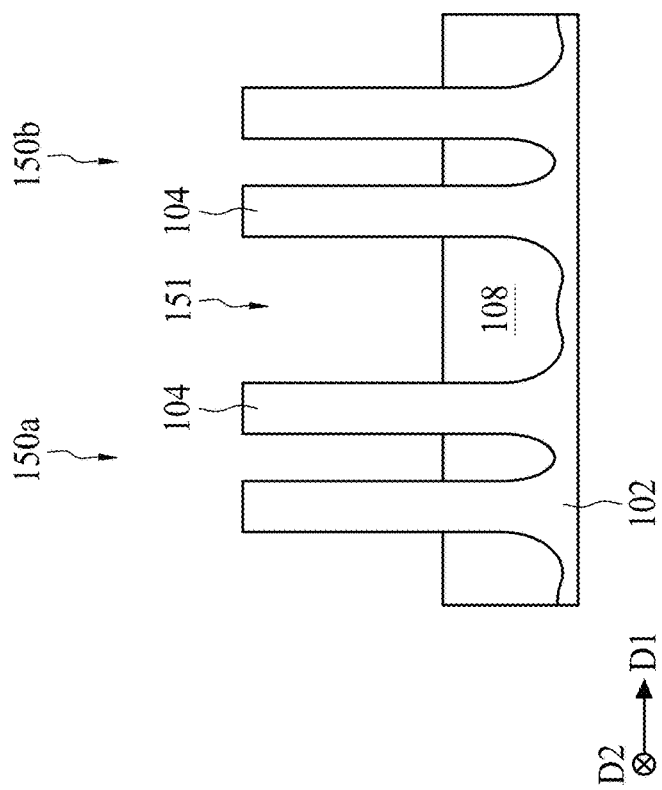
Figure 7A:
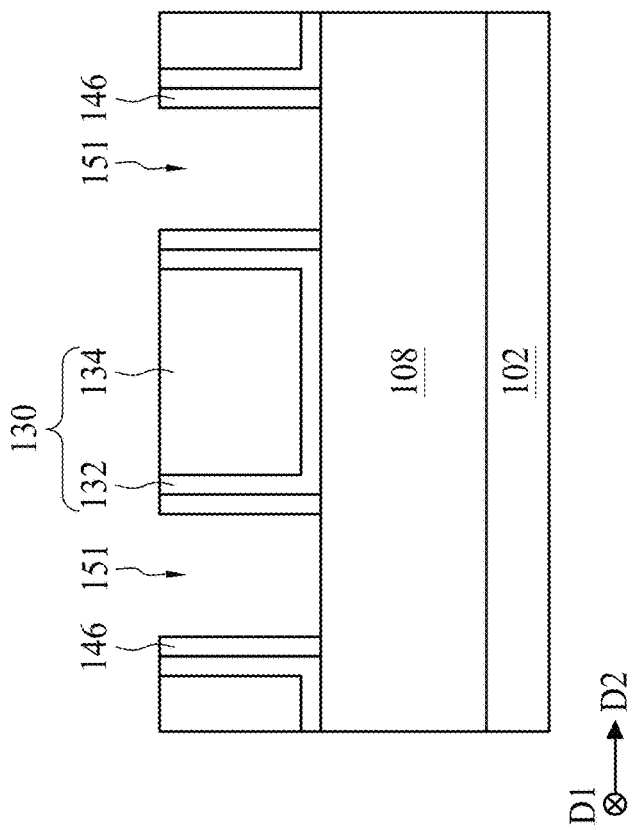

Referring to FIGS. 7A and 7B, the electrode layer 143 and the dielectric layer 141 of the sacrificial gate structure 140 are removed to form the first trench 151 (also referred to as a gate trench). The first trench 151 extends in the first direction D1. The first trench 151 is formed in the first FinFET device 150a and the second FinFET device 150b. Further, the first trench 151 couples the first FinFET device 150a to the second FinFET device 150b, as shown in FIG. 7A. Thus, the fins 104 of the first FinFET device 150a and the fins 104 of the second FinFET device 150b are exposed through the same first gate trench 151, as shown in FIG. 7A, while the spaces 146 of different sacrificial gate structures 140 are exposed through different and separate first trenches 151, which are parallel to each other, as shown in FIG. 7B. In some embodiments, the removing of the electrode layer 143 and the dielectric layer 141 may include an etching process, and the etching processes may include dry etching, wet etching, reactive ion etching, or other suitable etching methods.

In operation 203, a metal gate feature is formed in the first trench 151.

Referring to FIGS. 8A and 8B, the metal gate feature 152 is formed to fill each first trench 151. In some embodiments, the metal gate feature 152 includes a high-k gate dielectric layer 112 and a gate conductive layer 114. In some embodiments, the metal gate feature 152 may further include an interfacial layer (IL) (e.g., silicon oxide) (not shown) between the high-k gate dielectric layer 112 and the fins 104. The interfacial layer may be formed using chemical oxidation, thermal oxidation, atomic layer deposition (ALD), chemical vapor deposition (CVD), and/or other suitable methods. The materials of the high-k gate dielectric layer 112 and the gate conductive layer 114 have been discussed above with reference to FIGS. 1, 2A and 2B. In some embodiments, the high-k gate dielectric layer 112 may include one or more layers of high-k dielectric material, and may be deposited using CVD, ALD and/or other suitable methods. In some embodiments, the gate conductive layer 114 may include one or more work function metal layers and a metal fill layer, and may be deposited using methods such as CVD, PVD, plating, and/or other suitable processes.

In some embodiments, the metal gate feature 152 extends in the first direction D1 and couples the first FinFET device 150a to the second FinFET device 150b, as shown in FIG. 8A. In other embodiments, the metal gate features 152 are arranged to be parallel to each other in the second direction D2, as shown in FIG. 8B.

In operation 204, a portion of the metal gate feature 152 is removed to form a second trench.

Figure 9B:
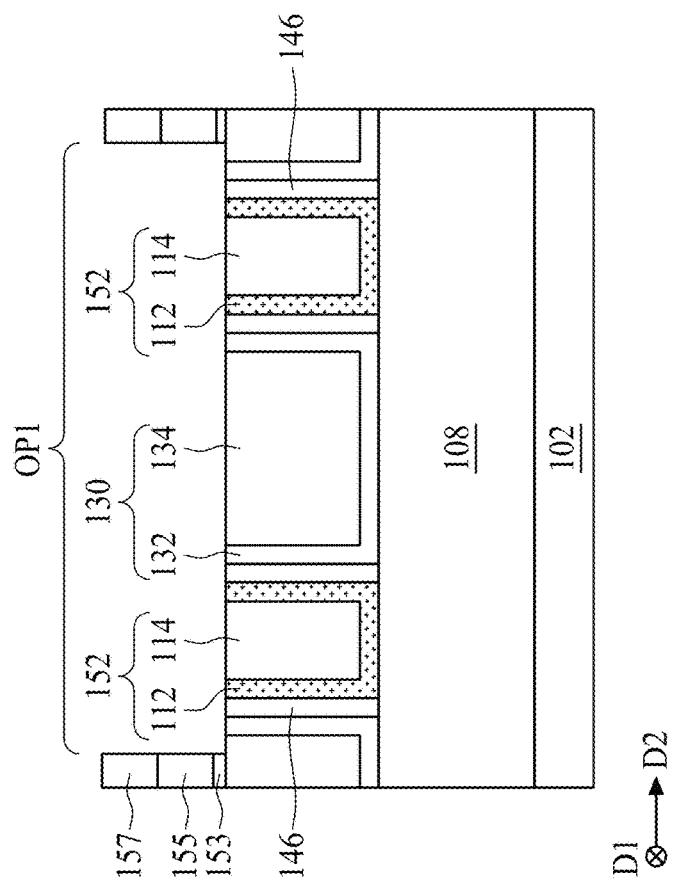
Figure 9A:
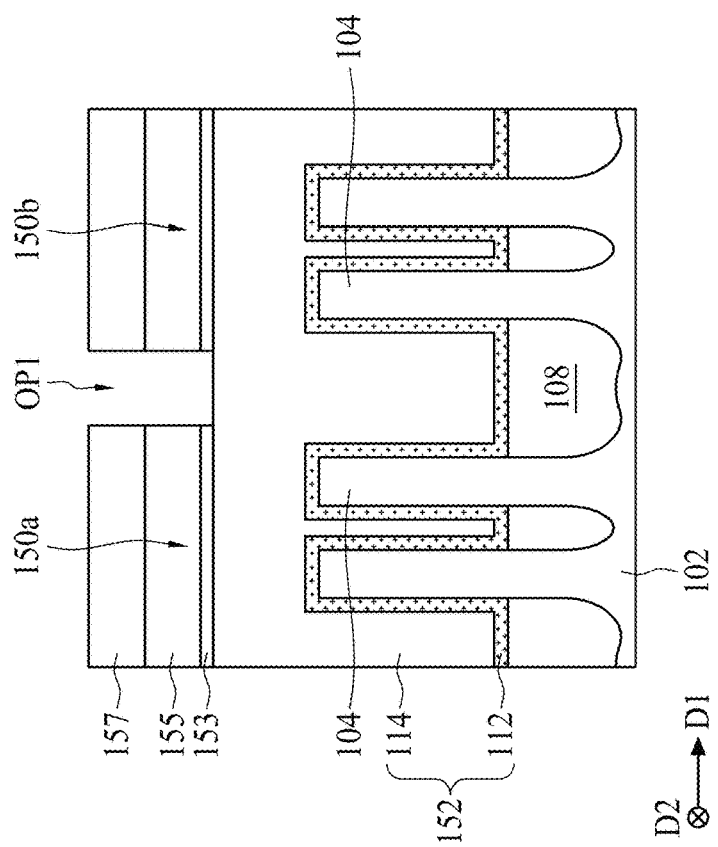

Referring to FIGS. 9A and 9B, in some embodiments, hard mask layers are formed over the devices 150a and 150b and the dielectric structure 130. In some embodiments, two hard mask layers 153 and 155 are formed. In some embodiments, the hard mask layer 153 includes titanium nitride, while the hard mask layer 155 includes silicon nitride, but the disclosure is not limited thereto. The hard mask layers 153 and 155 may be deposited using CVD, PVD, ALD, or other suitable methods. A patterned photoresist layer 157 is formed over the hard mask layers 153 and 155. The patterned photoresist layer 157 may be formed by photoresist coating, exposing, post-exposure baking, and developing.

Still referring to FIGS. 9A and 9B, in some embodiments, the hard mask layers 153 and 155 are etched through the patterned photoresist layer 157, thus forming an opening OP1 in the hard mask layers 153 and 155. In some embodiments, the etching process may include wet etching, dry etching, reactive ion etching, or other suitable etching methods. The patterned photoresist layer 157 is removed thereafter, for example, by resist stripping.

Referring to FIGS. 10A and 10B, the metal gate feature 152 is etched through the opening OP1. In some embodiments, portions of the dielectric structure 130 are also removed through the opening OP1. Accordingly, the second trench 159 (also referred to as a cut-metal gate (CMG) trench) is formed. As shown in FIG. 10A, portions of the metal gate feature 152 are exposed through sidewalls of the second trench 159. In some embodiments, a portion of the isolation structure 108 is exposed through a bottom of the second trench 159. In some embodiments, a portion of the isolation structure 108 is exposed through the sidewall of the second trench 159. As shown in FIG. 10B, in some embodiments, portions of the dielectric structure 130 are exposed through sidewalls of the second trench 159.

In operation 205, an isolation structure is formed in the second trench 159.

Referring to FIGS. 11A and 11B, in some embodiments, a low-k material 160 is formed in the second trench 159. For example, the low-k material 160 may include silicon oxide or porous low-k dielectrics, such as porous silica, but the disclosure is not limited thereto. The low-k material 160 may be formed by CVD, PECVD, ALD, flowable CVD (FCVD), or a spin-on-glass process. In some embodiments, when the FCVD 161 is used, a flowable low-k dielectric material 160, which may be a liquid compound, is formed to fill the second trench 159.

Referring to FIGS. 12A and 12B, in some embodiments, a nitrogen-containing (N-containing) treatment 163 is performed to form a dielectric layer 122 after the FCVD. In some embodiments, the N-containing treatment 163 includes an N-containing gas soaking. For example, the N-containing gas soaking 163 includes an ammonia ($NH_3$) soaking. In some embodiments, the $NH_3$ soaking has a process temperature between approximately 300° C. and approximately 400° C., but the disclosure is not limited thereto. A process period of the $NH_3$ soaking is between approximately 5 minutes and approximately 10 minutes, but the disclosure is not limited thereto.

Figures 13A, 13B:
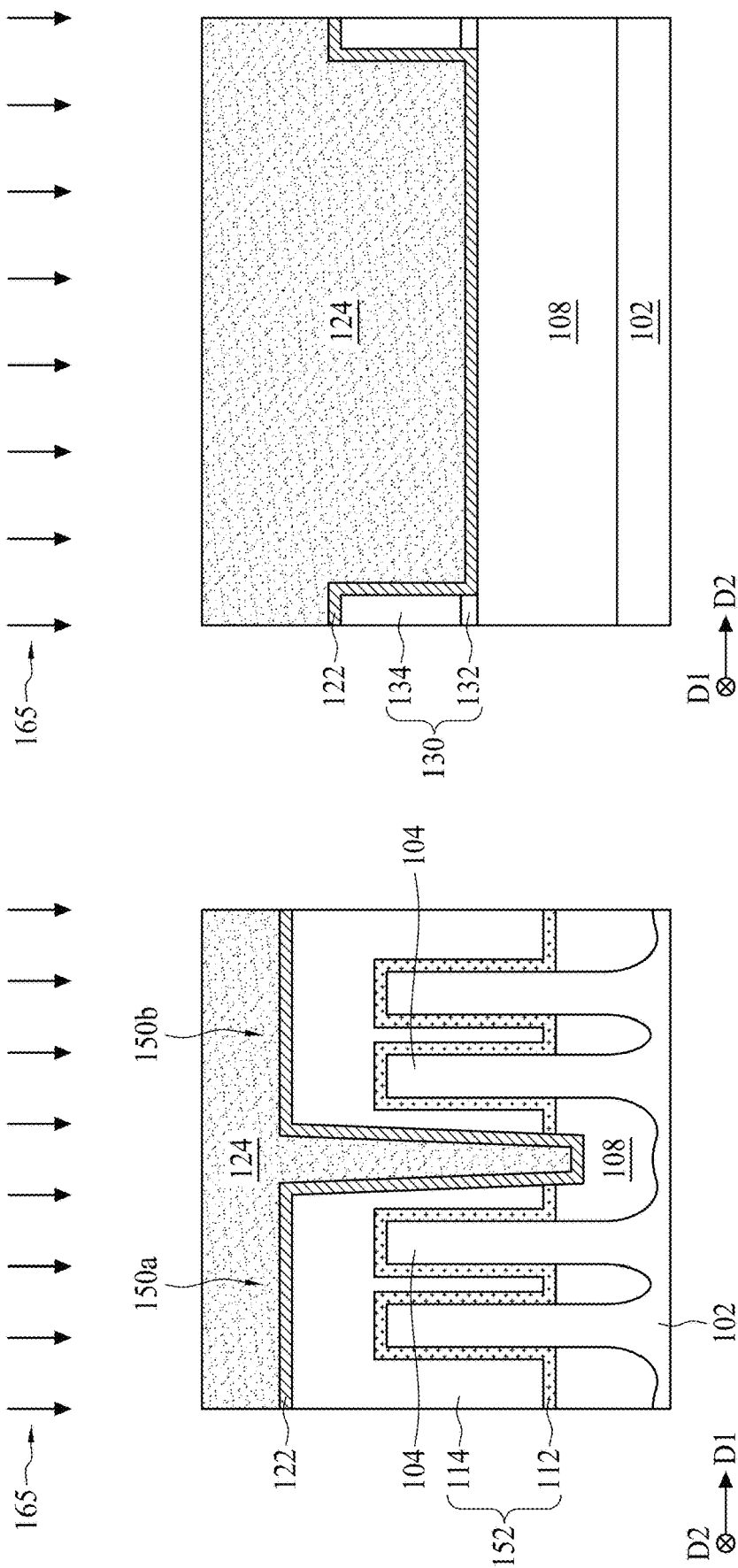

Referring to FIGS. 13A and 13B, in some embodiments, the low-k dielectric material 160 is converted to a solid material by a suitable technique, such as annealing or curing 165, after the N-containing treatment 163. The curing 165 may include an ozone ($O_3$) plasma curing, a low-temperature $O_3$ plasma curing, or a UV curing (LTB+UV curing). In some embodiments, a processing temperature of the UV curing process may be between approximately 0° C. and approximately 10° C. In some embodiments, a processing temperature range of the $O_3$ plasma curing process is between approximately 100° C. and approximately 250° C. In some embodiments, a processing temperature of the LTB+UV curing process is between approximately 30° C. and approximately 50° C. After the curing 165, the flowable low-k dielectric material 160 is converted into a dielectric feature 124.

Accordingly, in such embodiments, the dielectric feature 124 may include silicon oxide, and the dielectric layer 122 includes N-containing silicon oxide. In some embodiments, a nitrogen concentration of the dielectric layer 122 is approximately 10% greater than a nitrogen concentration of the dielectric feature 124. In some embodiments, the nitrogen concentration of the dielectric layer 122 is approximately 10% to approximately 20% greater than the nitrogen concentration of the dielectric feature 124.

Figures 14A, 14B:
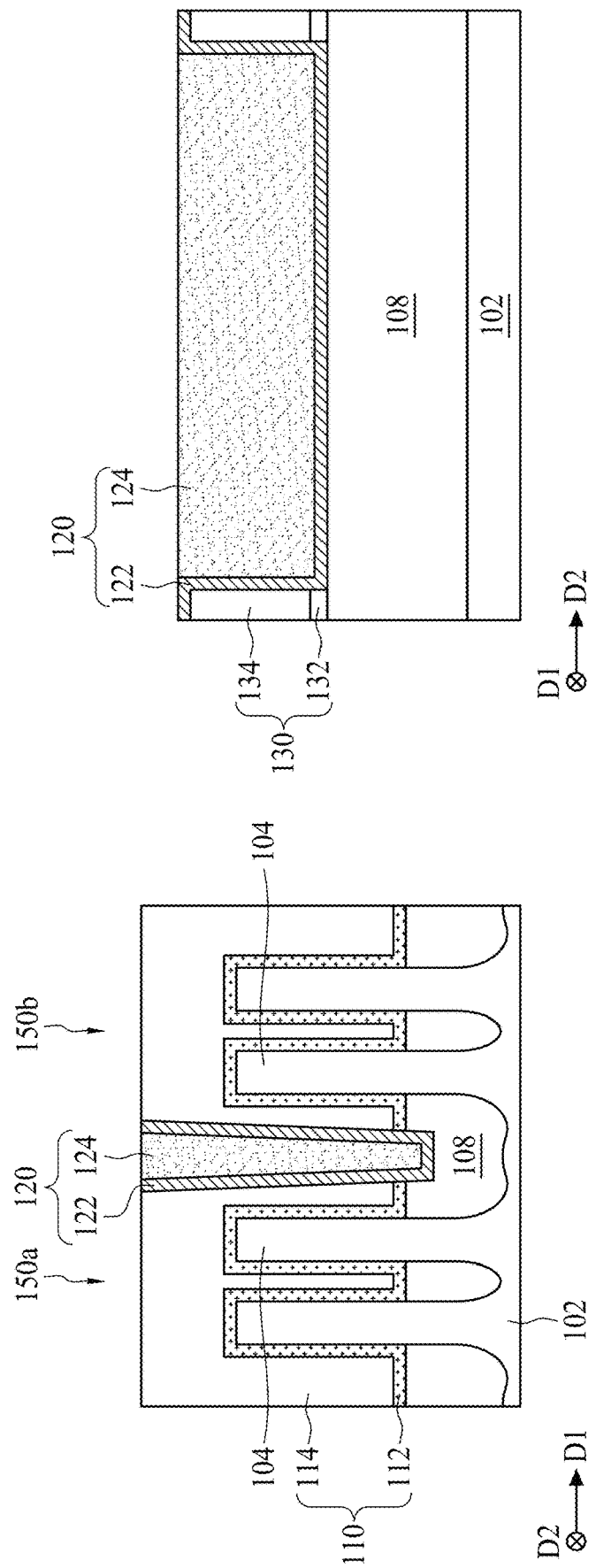

Referring to FIGS. 14A and 14B, a CMP may be performed to polish back the dielectric feature 124 and the dielectric layer 122 to form the isolation structure 120 (also referred to as a CMG dielectric) and to provide a substantially planar top surface of the isolation structure 120. As a result, the previously presented metal gate feature 152 is cut to form metal gate structures 110 for the first FinFET device 150a and the second FinFET device 150b, respectively.

Figures 15A, 15B:
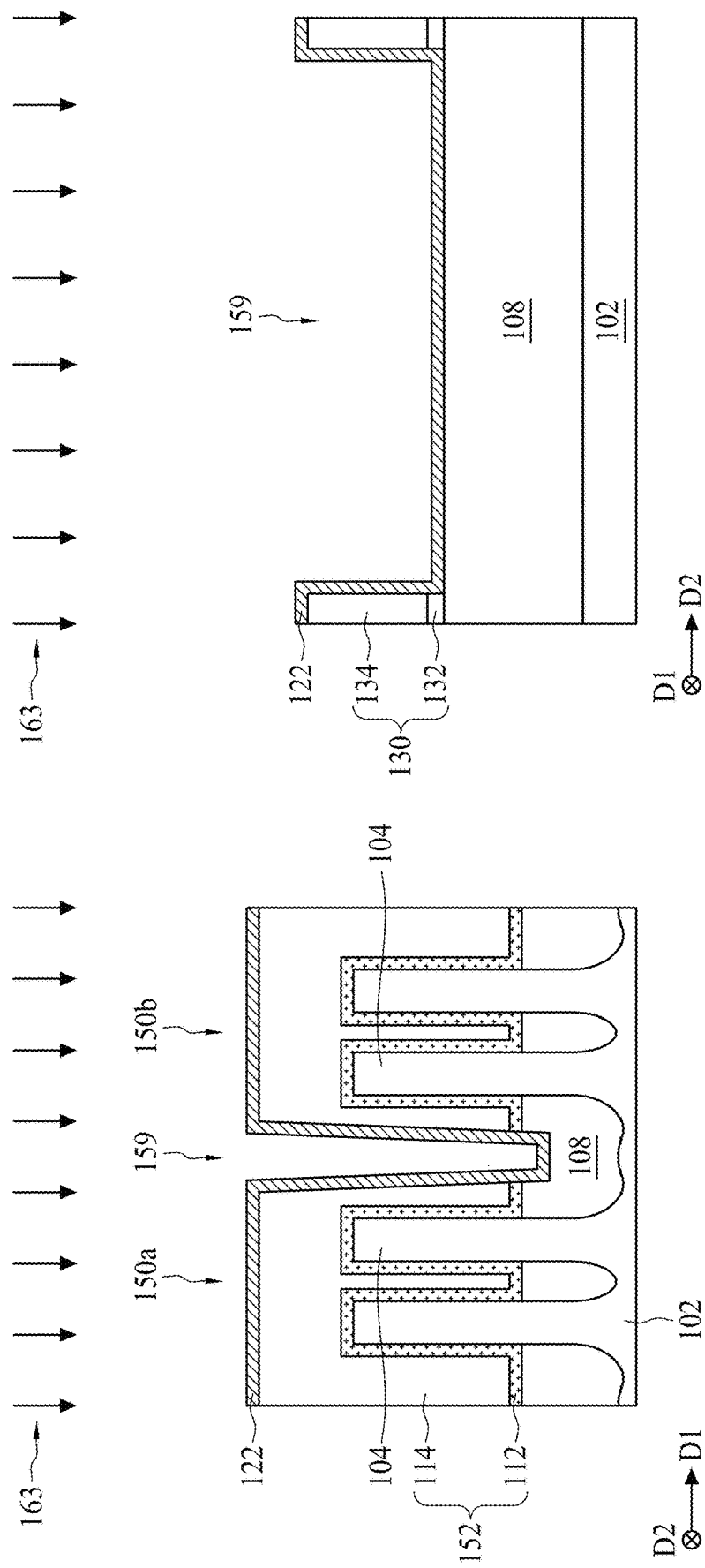

FIGS. 15A to 18B illustrate a method for manufacturing a semiconductor structure at various stages according to aspects of the present disclosure in one or more embodiments, wherein FIGS. 15A, 16A, 17A and 18A are cross-sectional views of the semiconductor structure taken along line I-I' of FIG. 1, and FIGS. 15B, 16B, 17B and 18B are cross-sectional views of the semiconductor structure taken along line II-II' of FIG. 1. In some embodiments, FIGS. 15A and 15B show a stage subsequent to FIGS. 10A and 10B.

In some embodiments, the N-containing treatment 163 is performed to form a dielectric layer 122 in the second trench 159, as shown in FIGS. 15A and 15B. In such embodiments, N-containing treatment 163 includes a N-containing gas or a N-containing plasma treatment. In such embodiments, a process period of the N-containing treatment 163 may be less 5 minutes. In such embodiments, the dielectric layer 122 may include a silicon nitride.

Figures 16A, 16B:
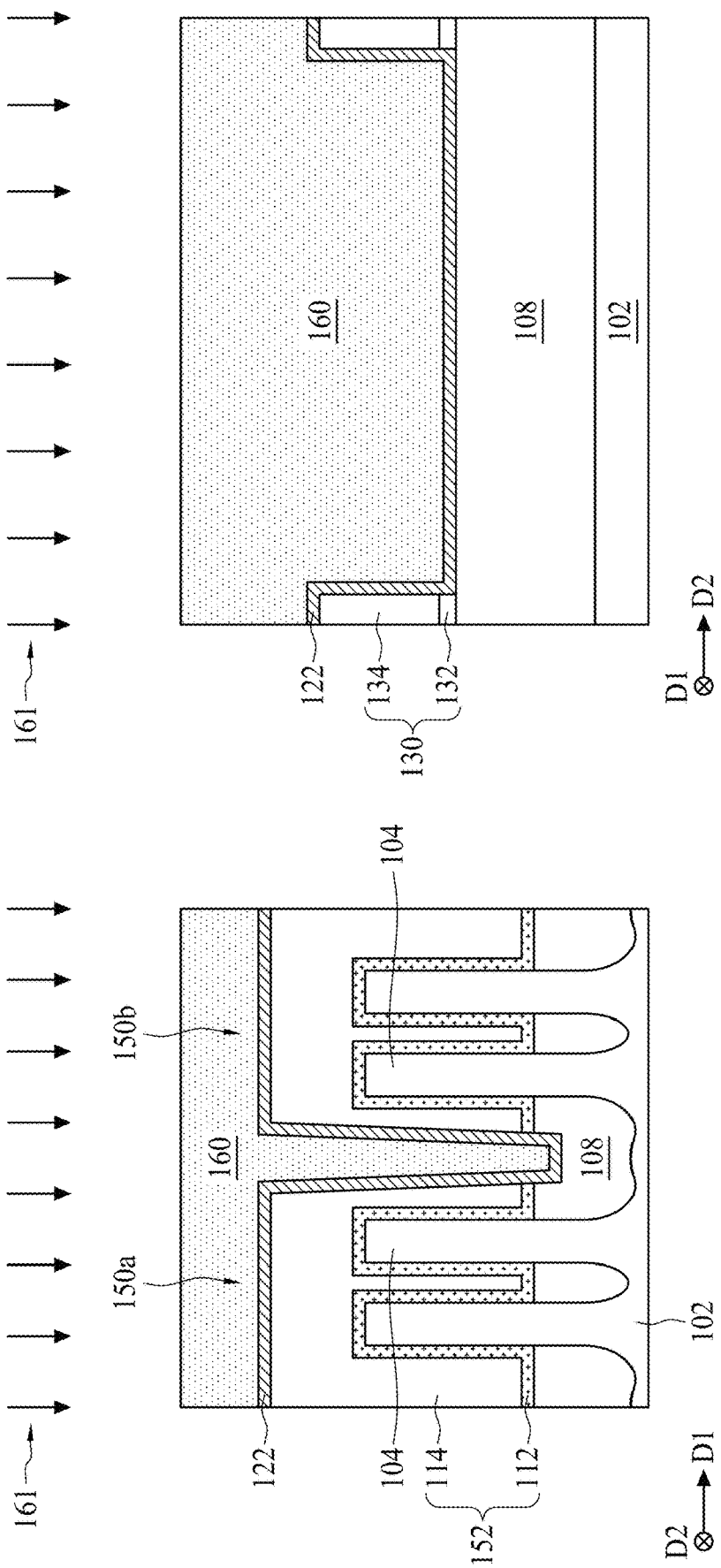

Referring to FIGS. 16A and 16B, in some embodiments, after the nitrogen-containing treatment 163, a low-k material 160 is formed to fill the second trench 159. As mentioned above, the low-k material 160 may include silicon oxide, porous low-k dielectrics, such as porous silica, but the disclosure is not limited thereto. The low-k material 160 may be formed by CVD, PECVD or ALD, FCVD, or a spin-on-glass process. In some embodiments, when the FCVD 161 is used, a flowable low-k dielectric material 160, which may a liquid compound, is formed to fill the second trench 159.

Figures 17A, 17B:
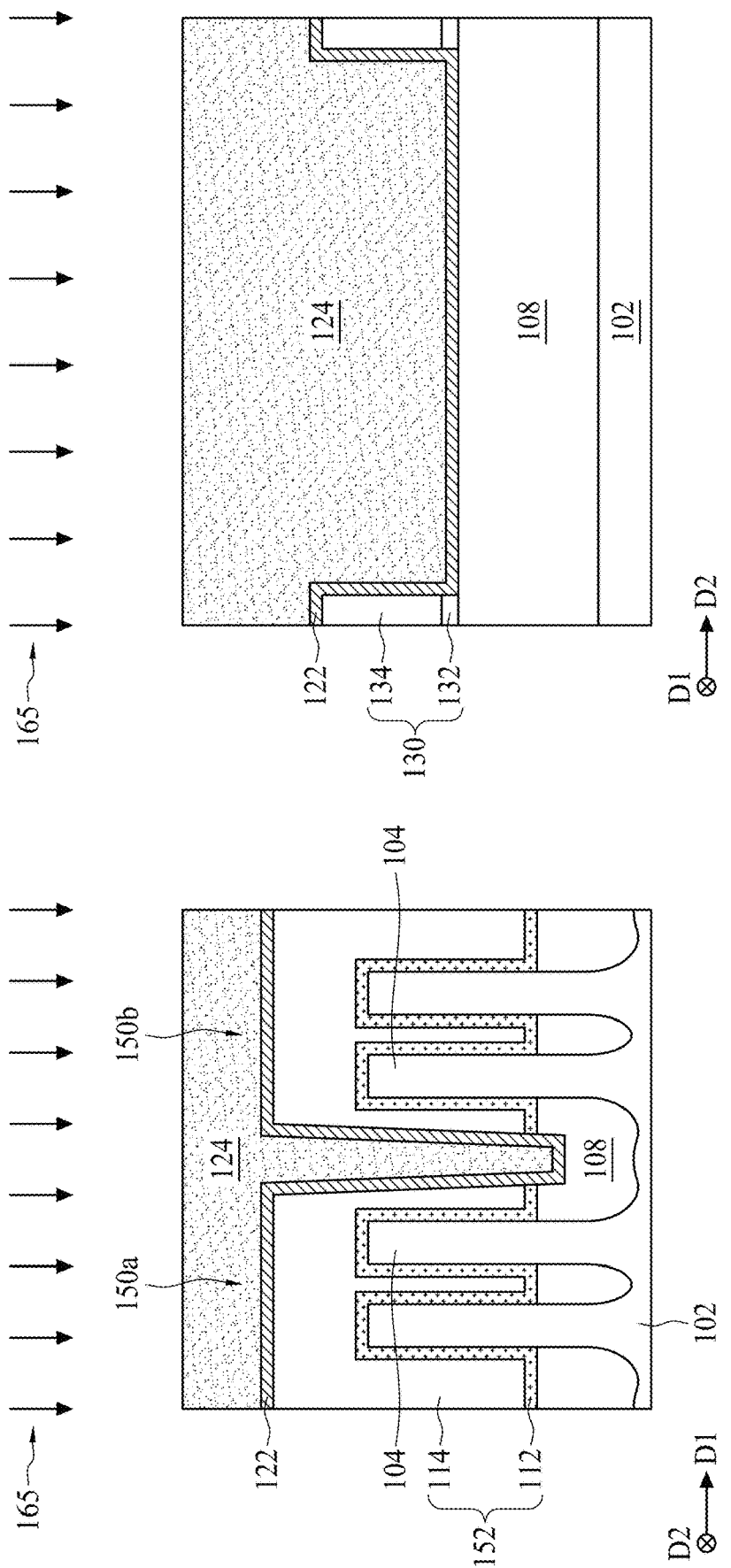

Referring to FIGS. 17A and 17B, after the FCVD 161, the low-k dielectric material 160 is converted to a solid material by a suitable technique, such as annealing or curing 165. The curing may include an ozone ($O_3$) plasma curing, a low-temperature $O_3$ plasma curing, or an UV curing (LTB+UV curing). A processing temperature range of the UV curing process may be between approximately 0° C. and approximately 10° C., in some embodiments. Accordingly, the flowable low-k dielectric material 160 is converted into a dielectric feature 124.

Referring to FIGS. 18A and 18B, a CMP may be performed to polish back the dielectric feature 124 and the dielectric layer 122 hereby to form the isolation structure 120 and to provide a substantially planar top surface of the isolation structure 120. As a result, the previously presented metal gate feature 152 is cut to form metal gate structures 110 for the first FinFET device 150a and the second FinFET device 150b, respectively.

FIGS. 19 to 23 illustrate a method for manufacturing a semiconductor structure at various stages according to aspects of the present disclosure in one or more embodiments, and illustrate cross-sectional views of the semiconductor structure taken along III-III' line of FIG. 1. In some embodiments, FIG. 19 may be in a stage subsequent to FIG. 14B or FIG. 18B.

Figure 19:
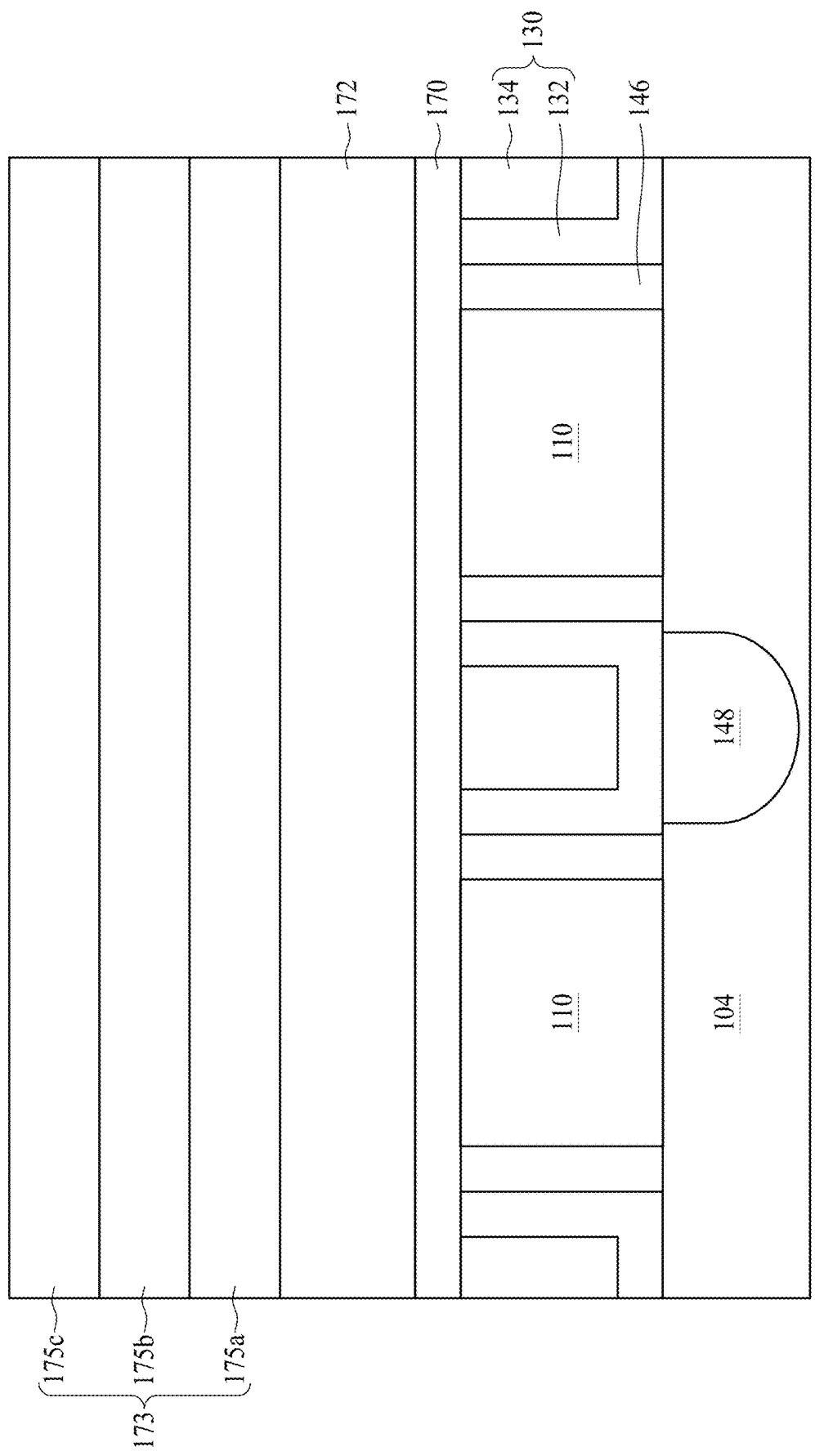
FIGS. 19 to 23 illustrate a method for manufacturing a semiconductor structure at various stages according to aspects of the present disclosure in one or more embodiments, and illustrate cross-sectional views of the semiconductor structure taken along line III-III' of FIG. 1.

Referring to FIG. 19, in some embodiments, a protecting layer 170 and another dielectric structure such as an ILD 172 may be formed over the substrate 102. In some embodiments, the protecting layer 170 may include silicon nitride, and the ILD 172 may include silicon oxide, but the disclosure is not limited thereto. In some embodiments, a thickness of the ILD 172 is greater than a thickness of the protecting layer 170.

Still referring to FIG. 19, in some embodiments, a hard mask structure 173 may be formed over the ILD 172. In some embodiments, the hard mask structure 173 may include a plurality of layers. For example but not limited thereto, the hard mask structure 173 may include a first layer 175a including titanium nitride, a second layer 175b including silicon oxide, and a third layer 175c including silicon. A thickness of the second layer 175b may be greater than a thickness of the third layer 175c, and the thickness of the third layer 175c may be greater than a thickness of the first layer 175a, but the disclosure is not limited thereto. In some embodiments, a patterned photoresist layer (not shown) may be formed over the hard mask structure 173. The patterned photoresist layer may be formed by photoresist coating, exposing, post-exposure baking, and developing.

Figure 20:
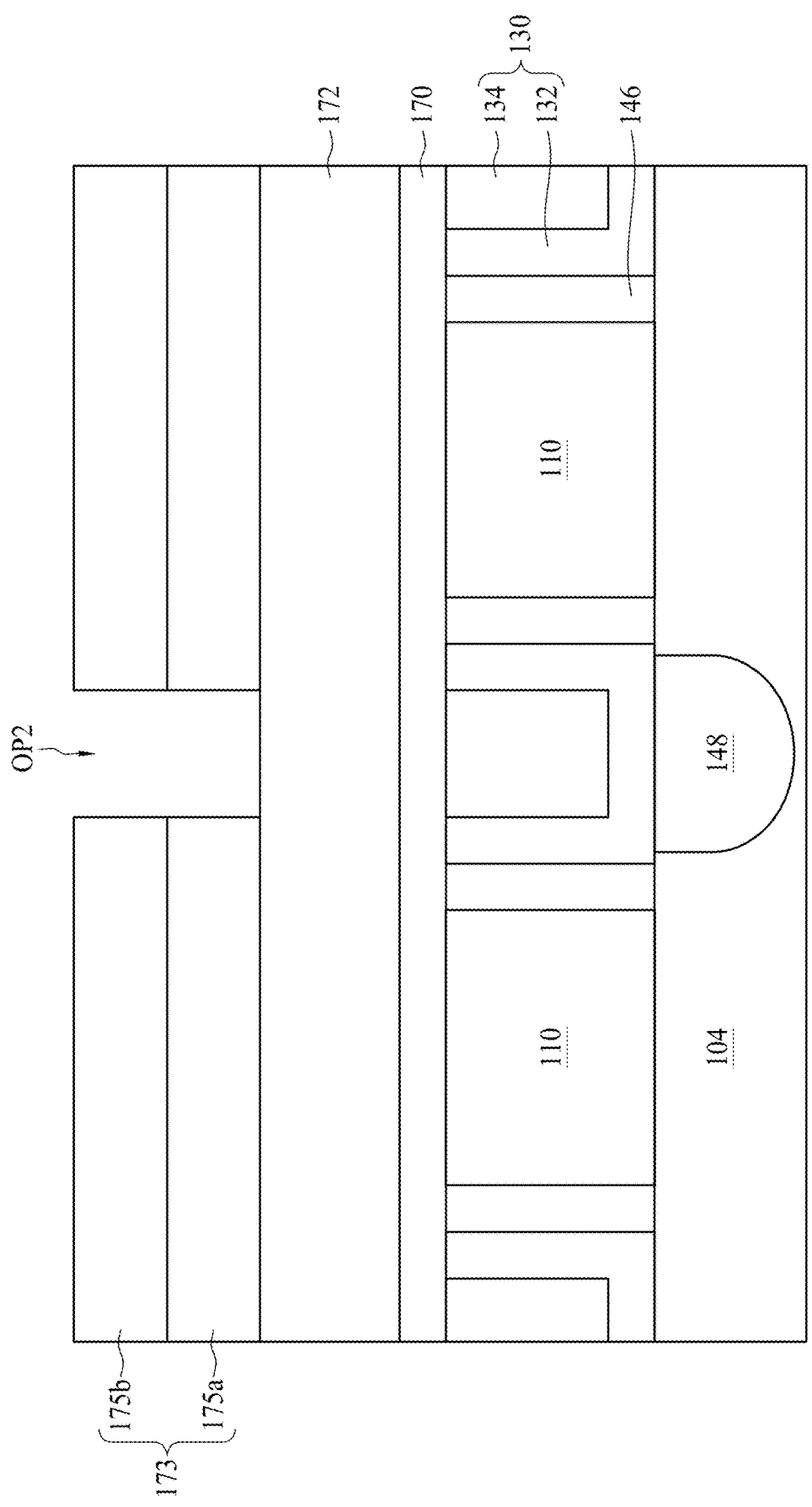

Referring to FIG. 20, in some embodiments, the hard mask structure 173 is etched through the patterned photoresist layer, thereby forming an opening OP2 in the hard mask structure 173. In some embodiments, the etching process may include wet etching, dry etching, reactive ion etching, or other suitable etching methods. The patterned photoresist layer is removed thereafter, for example, by resist stripping. In some embodiments, the third layer 175c of the hard mask structure 173 is also removed, as shown in FIG. 20, but the disclosure is not limited thereto.

Figure 21:
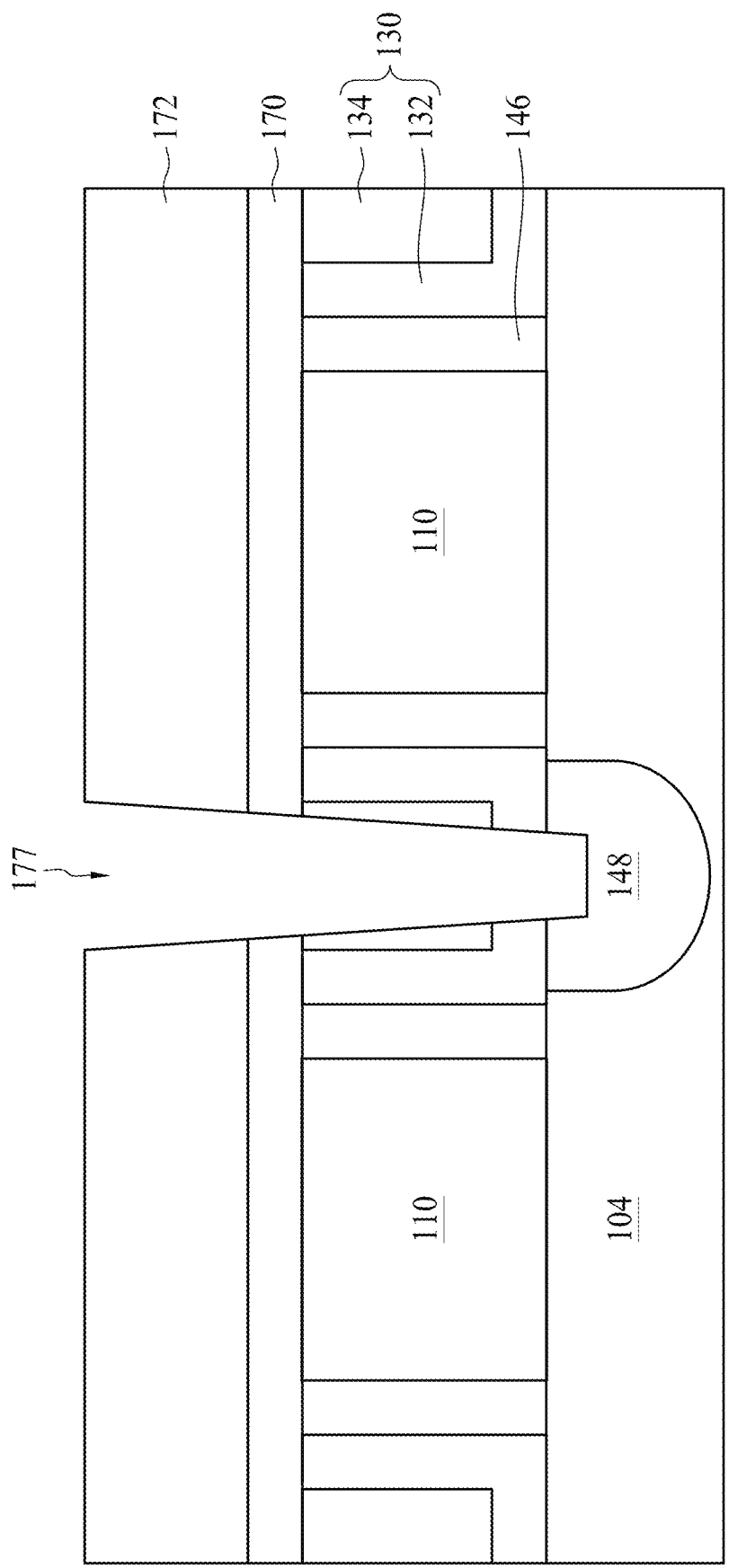

Referring to FIG. 21, in some embodiments, a third trench 177 is formed by etching through the patterned hard mask structure 173. The third trench 177 penetrates the ILD 172, the protecting layer 170 and the dielectric structure 130. Thus the source/drain structure 148 may be exposed through a bottom of the third trench 177, while the ILD 172, the protecting layer 170 and the dielectric structure 130 are exposed through sidewalls of the third trench 177. In some embodiments, the bottom of the third trench 177 may be lower than a top surface of the source/drain structure 148. In such embodiments, the source/drain structure 148 may also be exposed through the sidewall of the third trench 177. Additionally, the third trench 177 may have a tapper configuration, but the disclosure is not limited thereto.

Figure 22:
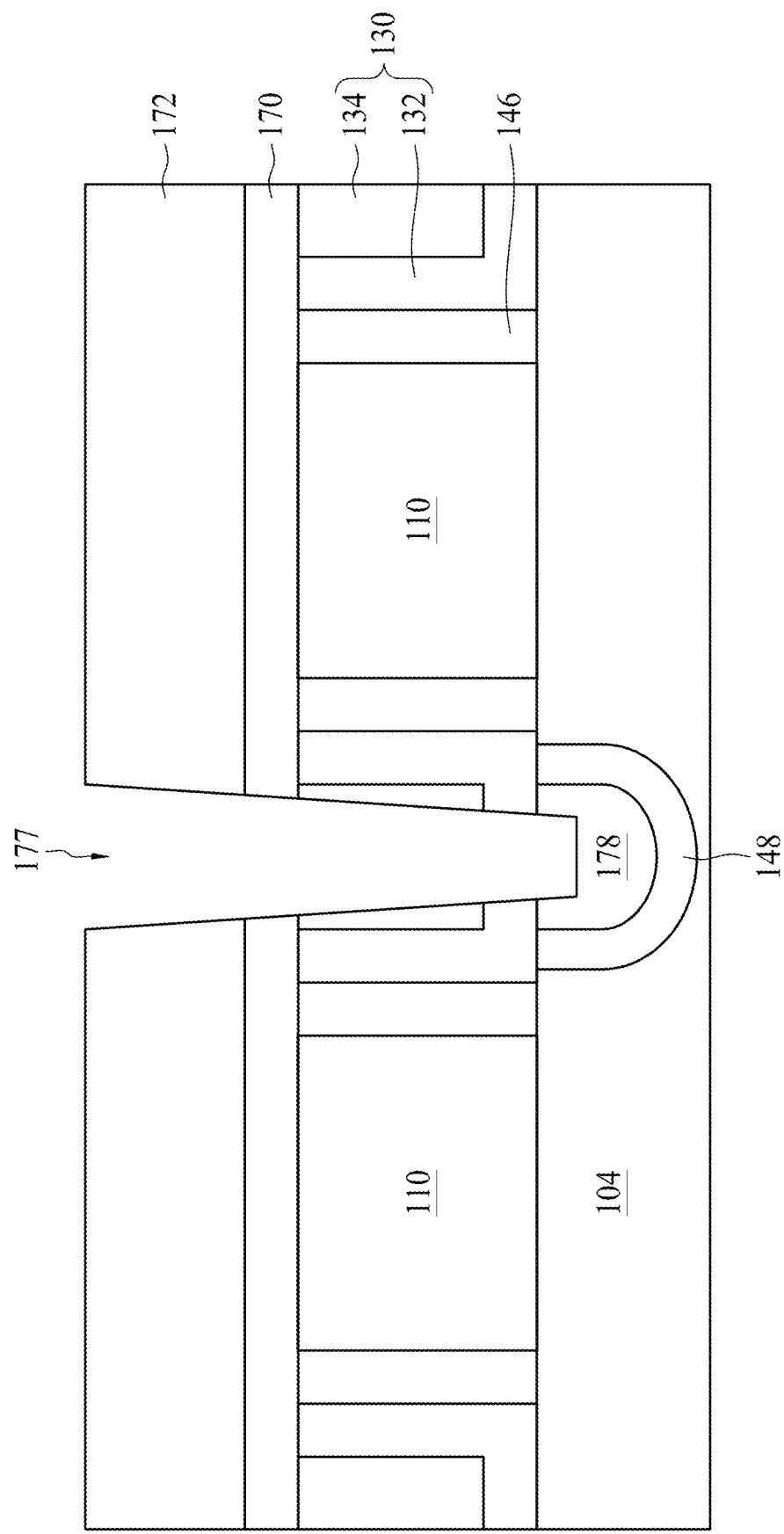

Referring to FIG. 22, in some embodiments, a silicide structure 178 may be formed in the source/drain structure 148. In some embodiments, the forming of the silicide structure 178 may include depositing a metal layer, causing the metal to react with the source/drain structure 148, and removing the un-reacted metal layer. In some embodiments, the silicide structure 178 can include cobalt silicide (CoSix), nickel silicide (NiSix), other suitable silicide layers, and/or combinations thereof.

Figure 23:
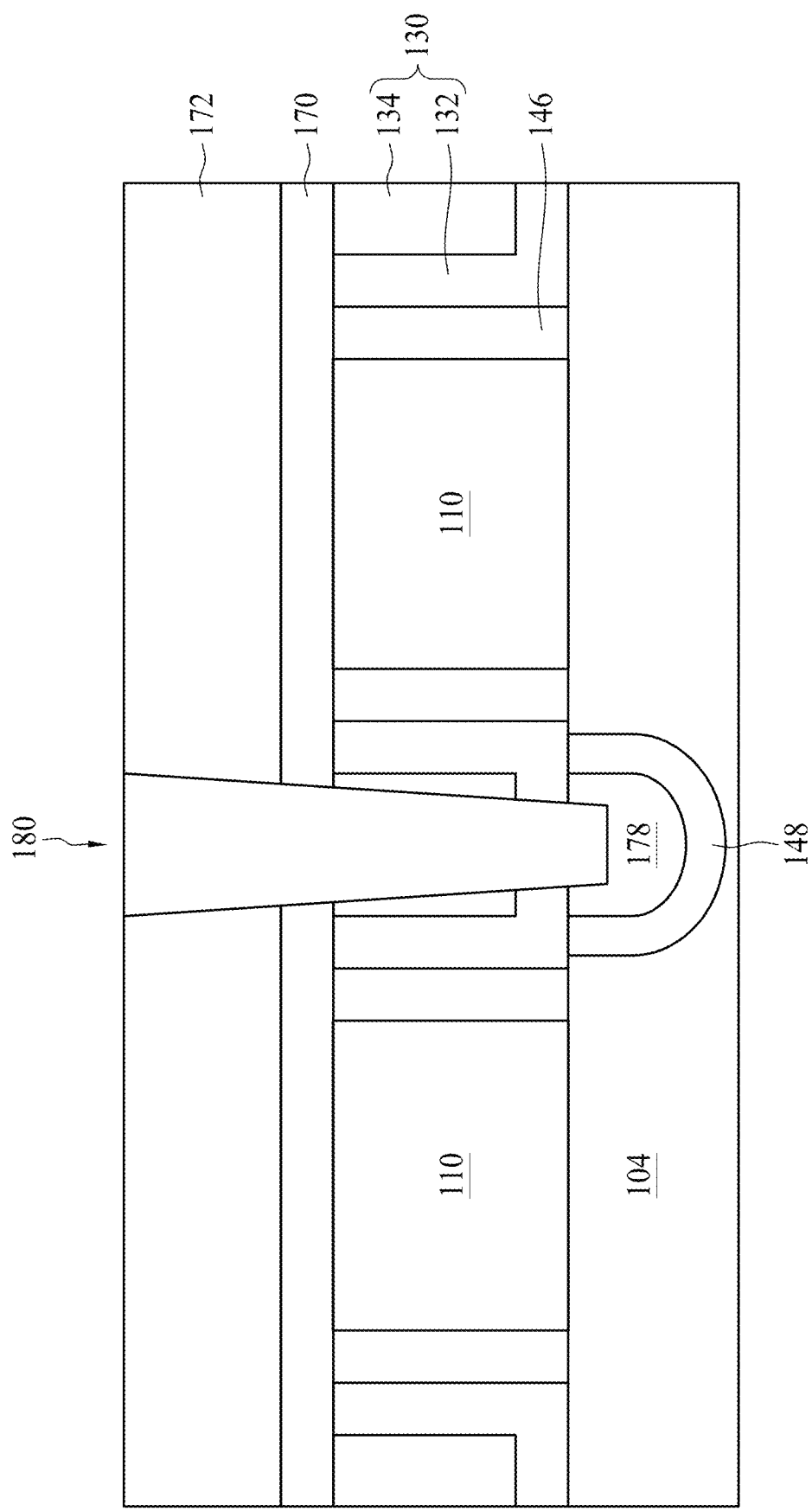

Referring to FIG. 23, in some embodiments, a connecting structure 180, such as a metal-to-drain (MD) structure, is formed to fill the third trench 177. The connecting structure 180 may include a barrier layer and a gap-filling low-resistance conductive layer. As shown in FIG. 23, the connecting structure 180 is in contact with the silicide structure 178. In some embodiments, the connecting structure 180 may include at least a barrier layer lining a bottom and sidewalls of the trench 177 and a conductive material filling the third trench 177, but the disclosure is not limited thereto.

It should be noted that in some embodiments, during the forming of the third trench 177, an overlay issue may occur, thus the third trench 177 may be formed not only in the dielectric structure 130, but also in the isolation structure 120 (though not shown). In such case, the low-k material of the dielectric feature 124 may be damaged during the etching. Further, the conductive materials used to form the connecting structure 180 may easily diffuse into the dielectric feature 124. Thus, a metal extrusion issue may arise. However, the dielectric layer 122 of the isolation structure 120 is able to withstand the etching and helps to obstruct the metal diffusion. Therefore, the metal extrusion issue is mitigated.

Accordingly, the isolation structure provided by the present disclosure includes the dielectric feature to comply with the low capacitance requirement, and the dielectric layer to mitigate the etching issue and the metal extrusion issue.

According to one embodiment of the present disclosure, a semiconductor structure is provided. The semiconductor structure includes a first FinFET device disposed over a substrate, a second FinFET device disposed over the substrate, and an isolation structure. The first FinFET device includes at least a first fin and a first metal gate structure over the first fin. The second FinFET device includes at least a second fin and a second metal gate structure over the second fin. The isolation structure is disposed between the first metal gate structure and the second metal gate structure. The isolation structure includes a dielectric feature and a dielectric layer. The dielectric layer is between the dielectric feature and the first metal gate structure, between the dielectric feature and the second metal gate structure, and between the dielectric feature and the substrate. The dielectric feature and the dielectric layer include different materials and different thicknesses.

According to one embodiment of the present disclosure, a semiconductor structure is provided. The semiconductor structure includes a first metal gate structure, a second metal gate structure, and an isolation structure between the first metal gate structure and the second metal gate structure. The first metal gate structure and the second metal gate structure extend in a first direction, and the isolation structure extends in a second direction different from the first direction. The isolation structure includes a dielectric feature and a dielectric layer. The dielectric layer is between the dielectric feature and the first metal gate structure, and between the dielectric feature and the second metal gate structure. The dielectric feature and the dielectric layer include different materials.

According to one embodiment of the present disclosure, a method for forming a semiconductor structure is provided. The method includes the following operations. A first FinFET device, a second FinFET device and a dielectric structure are formed over a substrate. The dielectric structure surrounds the first FinFET device and the second FinFET device. A first trench is formed in the first FinFET device and the second FinFET device. A metal gate feature is formed in the first trench. A portion of the metal gate feature is removed to form a second trench in the metal gate feature. An isolation structure is formed in the second trench. The isolation structure includes a dielectric layer and a dielectric feature over the dielectric layer. The dielectric layer and the dielectric feature include different materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a first FinFET device, a second FinFET device and a dielectric structure over a substrate, wherein the dielectric structure surrounds the first FinFET device and the second FinFET device;
    forming a first trench in the first FinFET device and the second FinFET device;
    forming a metal gate feature in the first trench;
    removing a portion of the metal gate feature to form a second trench in the metal gate feature; and
    forming an isolation structure in the second trench, wherein the forming of the isolation structure further comprises:
        performing a flowable chemical vapor deposition (FCVD) to form a dielectric material in the second trench;
        performing a nitrogen-containing treatment to form a dielectric layer after the FCVD; and
        performing a UV curing to cure the dielectric material to form a dielectric feature after the nitrogen-containing treatment,
    wherein the isolation structure comprises the dielectric layer and the dielectric feature over the dielectric layer, and the dielectric layer and the dielectric feature comprise different dielectric materials.

2. The method of claim 1, wherein the nitrogen-containing treatment comprises an ammonia (NH$_3$) soaking.

3. The method of claim 1, wherein the nitrogen-containing treatment comprises a nitrogen-containing gas or a nitrogen-containing plasma treatment.

4. The method of claim 1, further comprising forming a connecting structure coupled to the first FinFET device or the second FinFET device.

5. A method for forming a semiconductor structure, comprising:
    forming a first FinFET device and a second FinFET device over a substrate;
    forming a metal gate feature coupling the first FinFET device and the second FinFET device;
    cutting the metal gate feature to form a trench interrupting the metal gate feature;
    performing a flowable chemical vapor deposition (FCVD) to form a dielectric material to fill the trench;
    performing a nitrogen-containing treatment to form a dielectric layer under the dielectric material; and
    performing a UV curing to convert the dielectric material into a dielectric feature over the dielectric layer.

6. The method of claim 5, wherein the nitrogen-containing treatment is performed before the UV curing and after the FCVD.

7. The method of claim 5, wherein the nitrogen-containing treatment comprises an ammonia (NH$_3$) soaking.

8. The method of claim 5, wherein the nitrogen-containing treatment comprises a nitrogen-containing gas or a nitrogen-containing plasma treatment.

9. The method of claim 5, wherein the dielectric layer and the dielectric feature comprise different dielectric materials.

10. The method of claim 5, further comprising forming a dielectric structure surrounding the first FinFET device and the second FinFET device.

11. The method of claim 10, wherein the trench comprising:
    a first sidewall exposing the metal gate feature; and
    a second sidewall exposing the dielectric structure.

12. The method of claim 5, further comprising an isolation structure over the substrate.

13. The method of claim 12, wherein a bottom of the trench is lower than a top surface of the isolation structure.

14. The method claim 12, wherein a bottom of the dielectric feature is lower than a top surface of the isolation structure.

15. The method of claim 5, further comprising forming a connecting structure coupled to the first FinFET device or the second FinFET device.

16. A method for forming a semiconductor structure, comprising:
    forming a first FinFET device, a second FinFET device and a dielectric structure surrounding the first FinFET device and the second FinFET device;
    forming a metal gate feature coupling the first FinFET device and the second FinFET device;
    removing a portion of the metal gate feature to form a trench to cut the metal gate feature to form a first metal gate structure in the first FinFET device and a second metal gate structure in the second FinFET device;
    performing a nitrogen-containing treatment to form a dielectric layer in the trench;
    performing a flowable chemical vapor deposition (FCVD) to form a dielectric material to fill the trench after the nitrogen-containing treatment; and
    performing a UV curing to convert the dielectric material into a dielectric feature over the dielectric layer.

17. The method of claim 16, wherein the nitrogen-containing treatment comprises an ammonia (NH$_3$) soaking.

18. The method of claim 16, wherein the nitrogen-containing treatment comprises a nitrogen-containing gas or a nitrogen-containing plasma treatment.

19. The method of claim 16, wherein the trench comprising:
    a first sidewall exposing the metal gate feature; and
    a second sidewall exposing the dielectric structure.

20. The method of claim 19, wherein dielectric layer covering the first sidewall and the second sidewall of the trench, a top surface of the metal gate feature, and a top surface of the dielectric structure.

* * * * *